(12) United States Patent
Suhara

(10) Patent No.: US 6,958,917 B2
(45) Date of Patent: Oct. 25, 2005

(54) SUBSTRATE HOLDING DEVICE AND ELECTRIC-CIRCUIT FABRICATING PROCESS

(75) Inventor: Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 258 days.

(21) Appl. No.: 10/197,397

(22) Filed: Jul. 18, 2002

(65) Prior Publication Data

US 2003/0026065 A1 Feb. 6, 2003

(30) Foreign Application Priority Data

Jul. 25, 2001 (JP) ........................................ 2001-224490

(51) Int. Cl.[7] .............................. H05K 7/14; H05K 7/18
(52) U.S. Cl. ..................... 361/801; 361/802; 361/759; 361/747; 361/740; 361/741
(58) Field of Search .................................. 361/756, 759, 361/801, 802, 740, 741, 747, 732; 439/326, 327

(56) References Cited

U.S. PATENT DOCUMENTS

| | | | | |
|---|---|---|---|---|
| 4,136,917 A | * | 1/1979 | Then et al. | 439/326 |
| 5,676,561 A | * | 10/1997 | Chiang | 439/328 |
| 5,779,494 A | * | 7/1998 | Ito et al. | 439/326 |
| 5,785,549 A | * | 7/1998 | Takayasu | 439/495 |
| 5,822,183 A | * | 10/1998 | Kanda et al. | 361/684 |
| 5,846,095 A | * | 12/1998 | Bowen | 439/157 |
| 5,860,825 A | * | 1/1999 | Yodogawa | 439/326 |
| 5,863,213 A | * | 1/1999 | Enomoto et al. | 439/326 |
| 6,395,976 B1 | * | 5/2002 | Koradia et al. | 174/35 GC |
| 6,466,452 B2 | * | 10/2002 | Yamada et al. | 361/801 |
| 6,527,576 B1 | * | 3/2003 | Omote | 439/326 |
| 2002/0076985 A1 | * | 6/2002 | Lang et al. | 439/629 |

OTHER PUBLICATIONS

U.S. Appl. No. 10/104,037, filed Mar. 25, 2002, Suhara.

* cited by examiner

*Primary Examiner*—Amir Zarabian
*Assistant Examiner*—Thanh Y. Tran
(74) *Attorney, Agent, or Firm*—Oliff & Berridge, PLC

(57) ABSTRACT

A substrate holding device for holding a circuit substrate. The substrate holding device has a substrate clamping device including a receiving member and a movable member which is movable to force a portion of the circuit substrate against the receiving member, for thereby clamping the circuit substrate. At least one of the receiving member and the movable member has an elastically deformable portion provided by its contact portion which is to be brought into contact wiht the circuit substrate. The elastically deformable portion is preferably formed of a rubber or its equivalent material. The substrate holding device may have a movement-velocity reducing device which reduces the movement velocity of the movable member in a final stage of forward movement of the movable member toward the receiving member.

16 Claims, 19 Drawing Sheets

SUBSTRATE HOLDING DEVICE AND ELECTRIC-CIRCUIT FABRICATING PROCESS

BACKGROUND OF THE INVENTION

1. Field of the Invention

The present invention relates to a device for holding a ceramic substrate or other substrate made of a fragile material, for mounting an electric or electronic component onto the substrate, for applying an adhesive into a desired spot or spots of the substrate, or for other purpose. The invention also relates to a process of fabricating an electric circuit by using such a holding device.

2. Discussion of Related Art

There is known an operation for fabricating a printed circuit substrate or other electric circuit, by mounting electric components onto a circuit substrate such as a printed wiring board. Such a fabricating operation is commonly carried out by using a substrate work system equipped with a substrate holding device for holding the circuit substrate, a working head for achieving an operation in a predetermined portion of the circuit substrate held by the substrate holding device, and a relative movement device for moving the substrate holding device and the working head relative to each other. As such a substrate work system, there is known an adhesive applying system and an electric-component mounting system, for example. In the adhesive applying system, the working head takes the form of an applying head for applying an adhesive to the circuit substrate. In the electric-component mounting system, the working head takes the form of a mounting head for mounting the electric component onto the circuit substrate.

It is common that the above-described substrate working system is equipped with a substrate clamping device which includes a metallic receiving member and a metallic movable member adapted to force a peripheral or other portion of the circuit substrate against the receiving member, for thereby clamping the circuit substrate. However, it is not easy to clamp the circuit substrate in an appropriate manner, particularly, where the circuit substrate is provided by a fragile-material-made substrate such as a ceramic substrate made principally of a ceramic material. The ceramic material or other fragile material is likely to be broken or damaged with substantially no plastic deformation, if a large force or stress is applied to the circuit substrate. Therefore, where the circuit substrate is convexed, the circuit substrate is likely to be damaged if the circuit substrate is intended to be straightened by forcing the circuit substrate to be deformed in an amount too large for its elastic deformability. Further, there is a possibility that the circuit substrate might be damaged if the circuit substrate receives an excessively large load, for example, due to a shock generated when the circuit substrate is forced by the movable member against the receiving member.

SUMMARY OF THE INVENTION

The present invention was made in view of the above-described background situation, and has an object of obtaining a substrate holding device capable of holding a fragile substrate in an appropriate manner while preventing the fragile from being damaged. The present invention provides the following modes in the form of a substrate holding device or a process of fabricating an electric circuit by using the substrate holding device. Each of the modes is numbered like the appended claims and depends from the other mode or modes, as needed, for easy understanding of the present invention. It is to be understood that the technical features or any combinations thereof disclosed in the present specification is not limited to what are described in the following modes. It is to be further understood that a plurality of elements or features included in any one of the following modes of the invention are not necessarily provided all together, and that the invention may be embodied with selected one or ones of the elements or features described with respect to the same mode.

(1) A substrate holding device for holding a circuit substrate, the substrate holding device comprising:

a substrate clamping device including a receiving member and a movable member which forces a portion of the circuit substrate against the receiving member, for thereby clamping the circuit substrate, wherein at least one of the receiving member and the movable member has an elastically deformable portion formed of a rubber or its equivalent material and provided by a contact portion thereof which is to be brought into contact with the circuit substrate.

The present substrate holding device is suitable for holding a ceramic substrate or other substrate made of a fragile material. In the present substrate holding device, the contact portion of at least one of the receiving member and the movable member is provided by the elastically deformable portion which is formed of the rubber or its equivalent material, thereby making it possible to avoid stress concentration in a local portion or portions of a contact surface of the circuit substrate at which the circuit substrate is brought into contact with the above-described at least one of the receiving member and the movable member, and accordingly making it possible to avoid damaging of the circuit substrate. Even where the circuit substrate is upwardly or downwardly convexed, a predetermined work can be satisfactorily achieved on the circuit substrate without damaging of the circuit substrate due to an excessive deformation of the circuit substrate. In such a case where the circuit substrate is upwardly or downwardly convexed, it is preferable that the contact portions of both of the receiving member and the movable member are provided by the elastically deformable portions. However, the contact portions of both of the receiving member and the movable member do not have to be provided by the elastically deformable portion. That is, even where the contact portion of only one of the receiving and movable members is provided by the elastically deformable portion, a possibility of damaging of the circuit substrate can be made smaller as a result of a smaller amount of deformation of the circuit substrate, than where the contact portions of both of the receiving and movable members are formed of metallic material. The fragile-material-made substrate may be not only the ceramic substrate but also a glass substrate. In these days, a glass substrate is used mainly for an inspection for checking positioning accuracy of the electric components mounted on the substrate, but can be used for the other purpose.

It should be noted that the present substrate holding device is capable of holding, for example, a synthetic-resin-made substrate, too. In a case where such a synthetic-resin-made substrate is held by the present substrate holding device, the present invention provides substantially the same technical effects and advantages in greater or lesser degrees, as compared to a case where the fragile-material-made substrate is held by the substrate holding device. Further, the substrate holding device may be used for holding even a circuit substrate which is not likely to be damaged, namely, even where the technical advantages of the present invention are not appreciated so much.

(2) A substrate holding device according to mode (1), wherein the elastically deformable portion is formed of a rubber or its equivalent material which has an electric conductivity.

Since it is common that the receiving and movable members are made of a metallic material, the circuit substrate can be prevented from being electrified where the elastically deformable portion is formed of the rubber having an electric conductivity. By preventing electrification of the circuit substrate, it is possible to avoid sticking of dust to the circuit substrate, displacement of an electric component mounted at a predetermined spot and a failure to mount an electric component, which would be occurred due to static electricity. It is noted that a conductive passage such as a lead wire may be provided to connect the elastically deformable portion having the electric conductivity, with a main body of the device or other portion of the device made of a metallic material, where the receiving and movable members are not made of a metallic material.

(3) A substrate holding device according to mode (1) or (2), comprising:
an actuator which actuates the movable member; and
a movement-velocity controlling device controlling a movement velocity of the movable member actuated by the actuator.

The movement-velocity controlling device may be provided by a cam device or other mechanically controlling device disposed between the actuator and the movable member. Further, the movement-velocity controlling device may be provided by an electrically controlling device or an actuator-actuation-velocity controlling device which controls an actuation velocity of the actuator so as to control the movement velocity of the movable member. The feature described in this mode (3) is effectively applicable to a substrate holding device in which the feature described in the above-described mode (1) is not included, i.e., in which the elastically deformable portion is provided neither in the movable member nor in the receiving member.

(4) A substrate holding device according to mode (3), wherein the movement-velocity controlling device has a velocity reducing portion which reduces the movement velocity of the movable member in a final stage of forward movement of the elastically deformable portion of the movable member toward the receiving member.

The reduction in the movement velocity of the elastically deformable portion of the movable member in the final stage of the forward movement makes it possible to reduce a dynamic load applied to the circuit substrate upon contact of the movable and receiving members with the circuit substrate, thereby avoiding damaging of the circuit substrate upon the contact, irrespective of whether the circuit substrate held by the substrate holding device is substantially flat, upwardly convexed or downwardly convexed.

(5) A substrate holding device according to mode (4), wherein the velocity reducing portion gradually reduces the movement velocity of the movable member to substantially zero.

It is also possible to adapt the velocity reducing portion to reduce the movement velocity of the movable member in two or more steps in the final stage of the forward movement. However, it is preferable that the movement velocity is continuously or gradually reduced to substantially zero, for effectively reducing the impact load.

(6) A substrate holding device according to any one of modes (3)–(5), wherein the actuator is an air cylinder,
and wherein the movement-velocity controlling device includes an air-flow-rate controlling device controlling a flow rate of air to be supplied to the air cylinder.

In the arrangement in which the actuator is provided by the air cylinder and in which the flow rate of the air supplied to the air cylinder is controlled, it is possible to easily control the movement velocity of the movable member.

(7) A substrate holding device according to mode (6), wherein the air-flow-rate controlling device includes a variable flow regulator valve, and a regulator-valve controlling device which regulates the variable flow regulator valve in a final stage of forward movement of the elastically deformable portion of the movable member toward the receiving member.

In the substrate holding device of this mode, the movement velocity of the movable member can be appropriately controlled by the air-flow-rate controlling device which is relatively simple in construction.

(8) A substrate holding device according to any one of modes (1)–(7), comprising:
an actuator which actuates the movable member; and
an actuation-force controlling device controlling an actuation force with which the movable member is actuated by the actuator.

The arrangement of this mode makes it possible to avoid damaging of the circuit substrate due to an excessively large load. The feature described in this mode (8) is effectively applicable to a substrate holding device in which at least one of the feature of the above-described mode (1) and the feature of the above-described mode (3) is not included, i.e., in which the elastically deformable portion is provided neither in the movable member nor in the receiving member, and/or in which the movement-velocity controlling device is not provided.

(9) A substrate holding device according to mode (8), wherein the actuation-force controlling device controls the actuation force such that the actuation force is equalized to one of a plurality of different amounts which are predetermined for a plurality of kinds of circuit substrates to be clamped.

The plurality of kinds of circuit substrates may include circuit substrates different from each other in material and/or dimension. In the substrate holding device of this mode, a contact pressure given by the movable member can be controlled to a value suitable for the kind of the circuit substrate, thereby making it possible to prevent an excessively large load from being applied to a local portion of the circuit substrate and prevent the circuit substrate from being deformed in a large amount, whereby damaging of the circuit substrate can be reliably avoided.

(10) A substrate holding device according to mode (9), wherein the actuator is an air cylinder,
and wherein the actuation-force controlling device includes an air-pressure controlling device controlling a pressure of air to be supplied to the air cylinder.

It is also possible that the actuator may be provided by an electric motor so that the actuation force of the movable member is controllable by controlling an electric current to be supplied to the electric motor, or by controlling an electric voltage to be applied to the electric motor. However, the actuation force of the movable member can be more easily controlled in the arrangement in which the actuator is provided by the air cylinder and in which the pressure of air to be supplied to the air cylinder is controlled.

(11) A substrate holding device according to any one of modes (1)–(10), wherein the circuit substrate is a rectangular plate, and wherein the receiving member and the movable member grip two portions of the circuit substrate which portions are located along two mutually-parallel sides of the circuit substrate.

(12) A process of fabricating an electric circuit, by mounting a plurality of electric components onto a fragile-material-made substrate such as a ceramic substrate by a mounting device, while fixing the substrate to the mounting device by causing an elastically deformable portion of a movable member formed of a rubber or its equivalent material, to force a peripheral portion of the ceramic substrate against an elastically deformable portion of a receiving member formed of a rubber or its equivalent material.

It is also possible to provide only at least one of the movable and receiving members with the elastically deformable portion. The substrate holding device with such an arrangement provides the technical advantage in a certain degree. However, the damaging of the circuit substrate can be more reliably avoided, where the both of the movable and receiving members are provided with the respective elastically deformable portions. The feature described in each of modes (2)–(11) is applicable to the electric-circuit fabricating process of this mode (12).

DETAILED DESCRIPTION OF THE PREFERRED EMBODIMENTS

Hereinafter, an electronic-component mounting system equipped with a substrate holding device which is constructed according to an embodiment of the present invention will be explained in detail on the basis of the drawings. This electronic-component mounting system is capable of carrying out an electric-circuit fabricating process which is an embodiment of the invention described in claim 12.

Figure 1:
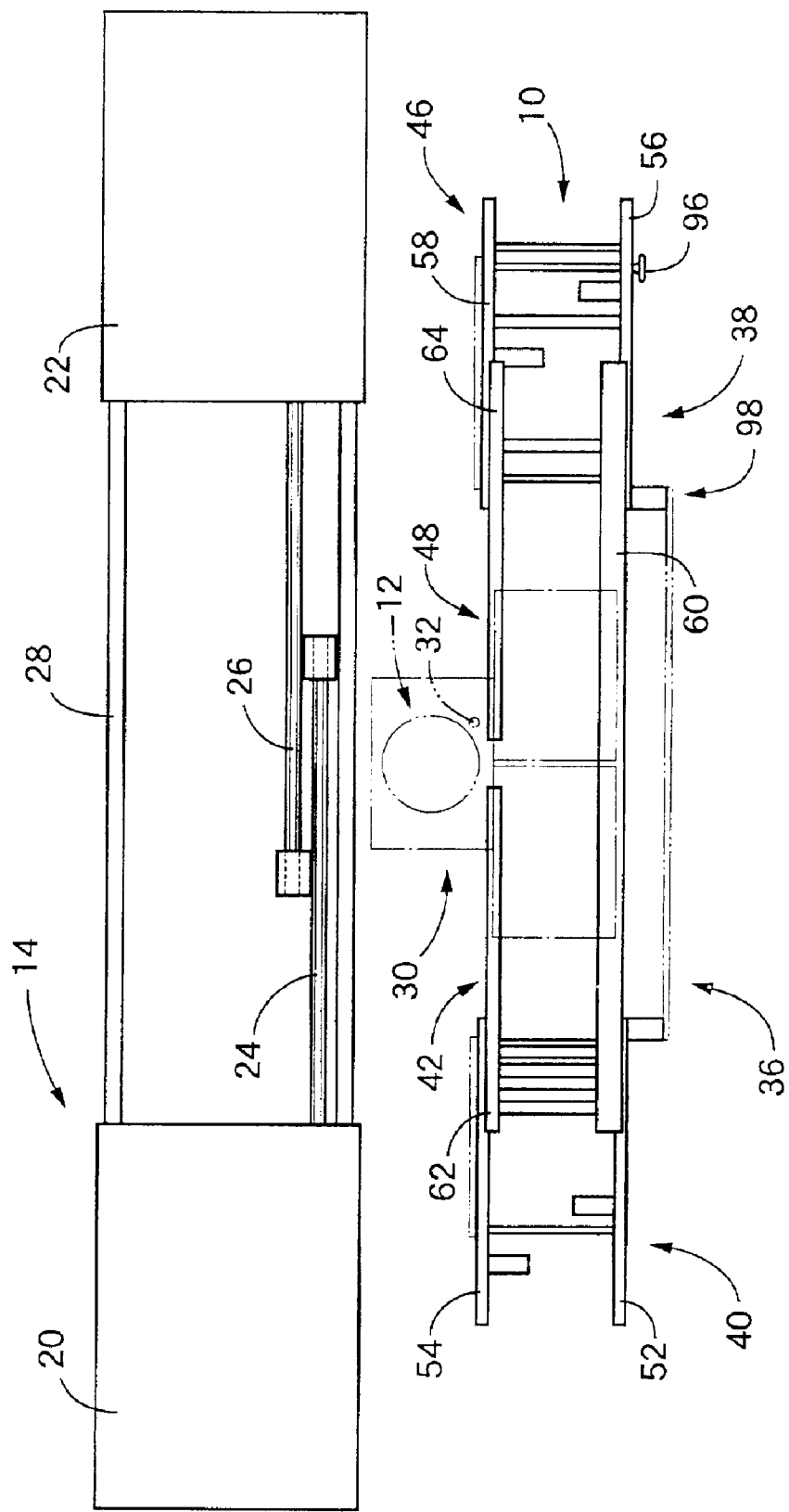
FIG. 1 is a plan view schematically showing the entirety of an electronic-component mounting system equipped with a substrate holding device which is constructed according to an embodiment of the present invention.

In FIG. 1, reference numerals 10, 12 and 14 denote a circuit-substrate transferring device, an electronic-component mounting device and an electronic-component supplying device, respectively. The electronic-component supplying device 14 includes component supplying tables 20, 22 on each of which a plurality of electronic-component supplying units are mounted. These component supplying tables 20, 22 are adapted to be movable along guide rails 28 by respective feed screw mechanisms 24, 26. When each of the component supplying tables 20, 22 has been positioned on a mounting position which is adjacent to the electronic-component mounting device 12, electronic components are supplied one after another to the electronic-component mounting device 12 from the electronic-component supplying units. In the present embodiment, each of the electronic-component supplying units is arranged to feed a carrier tape which accommodates the electronic components. That is, the electronic components as the electric components are supplied one after another to a component supplying portion, by a tape feeding device in synchronization with rotation of an index of the electronic-component mounting device 12. In the present embodiment in which the two component supplying tables 20, 22 are provided, it is possible to successively supply a large number of electronic components, or successively supply many kinds of electronic components.

In an electronic-component mounting position, the electronic-component mounting device 12 mounts the electronic components onto a circuit substrate which is held by a substrate holding device 30. In the present embodiment, as described later, the substrate holding device 30 is suitable for holding the circuit substrate in the form of a ceramic substrate 31 which is made principally of a ceramic material as a fragile material. The electronic-component mounting device 12 includes a plurality of suction heads each of which is adapted to suck and mount the electronic component. The suction heads are attached to a rotary disk which is intermittently rotatable, such that the suction heads are equiangular spaced from each other. The electronic components, supplied from the electronic-component supplying device 14, are sucked and mounted onto the ceramic substrate 31, one after another, with the intermittent rotation of the rotary disk. Thus, the supply of the electronic component and the mounting of the electronic component onto the ceramic substrate 31 are made simultaneously.

A fiducial-mark camera 32 is provided in the electronic-component mounting device 12. The electronic components are mounted onto the ceramic substrate 31, after the fiducial-mark camera 32 takes images of fiducial marks provided on the ceramic substrate 31. The fiducial-mark camera 32 takes the images of the fiducial marks one by one. However, the fiducial mark camera 32 may be modified to be capable of taking two or more images of the fiducial marks at one time.

The circuit-substrate transferring device 10 includes a substrate loading device 36 and a substrate unloading device 38, which are arranged along a transferring direction in which the ceramic substrate 31 is to be transferred. The substrate loading device 36 includes a horizontally loading device 40 which substantially horizontally moves the ceramic substrate 31 supplied from a circuit-substrate supplying device (not shown), so as to load the ceramic substrate 31. The substrate loading device 36 further includes a mounting device 42 which receives the ceramic substrate 31 loaded by the horizontally loading device 40 and then moves the ceramic substrate 31 in a thickness direction of the ceramic substrate 31, so as to mount the ceramic substrate 31 onto the substrate holding device 30. The substrate unloading device 38 includes a horizontally unloading device 46 which horizontally moves the ceramic substrate 31 having the electronic components mounted thereon, so as to unload the ceramic substrate 31. The substrate unloading device 38 further includes a demounting device 48 which moves the ceramic substrate 31 in the thickness direction, so as to demount the ceramic substrate 31 from the substrate holding device 30 and then hands over the ceramic substrate 31 to the horizontally unloading device 46. The horizontally loading device 40, the mounting device 42, the horizontally unloading device 46 and the demounting device 48 are described in detail in JP-A-H11-145681 (publication of Japanese Patent Application filed by the assignee of the present application). Only parts of these devices relating to the present invention will be briefly explained.

The horizontally loading device 40 and the horizontally unloading device 46 are disposed on a main body 50 (see FIG. 3) of the electronic-component mounting system, such that the devices 40, 46 are spaced apart from each other in the transferring direction (X-axis direction). As shown in FIG. 1, the horizontally loading device 40 has a pair of main bodies 52, 54 which are arranged in the transferring direction, as shown in FIG. 1. One 52 of the pair of main bodies 52, 54 is fixed, while the other 54 is movable toward and away from the fixed main body 52. Similarly, the horizontally unloading device 46 has a pair of main bodies 56, 58 which are arranged in the transferring direction. One 56 of the pair of main bodies 56, 58 is fixed, while the other 58 is movable toward and away from the fixed main body 56. Each of the mounting and demounting devices 42, 48 has a pair of main bodies, i.e., a fixed main body and a movable main body which are arranged in the transferring direction. The fixed main body 60 is commonly used for the mounting and demounting devices 42, 48, and is provided to bridge between the fixed main bodies 52, 56 of the respective loading and unloading devices 40, 46. The movable main body 62 of the mounting device 42 is fixed to the movable main body 54 of the loading device 40, while the movable main body 64 of the demounting device 48 is fixed to the movable main body 58 of the unloading device 46. Thus, since the main bodies 60, 62 of the mounting device 42 are respectively fixed to the main bodies 52, 54 of the horizontally loading device 40 while the main bodies 60, 64 of the demounting device 48 are respectively fixed to the main bodies 56, 58 of the horizontally unloading device 42, it is possible to move the movable main bodies simultaneously with each other, for adjusting the spacing distance between the main bodies (as viewed in a width direction of the transferred substrate).

Figure 2:
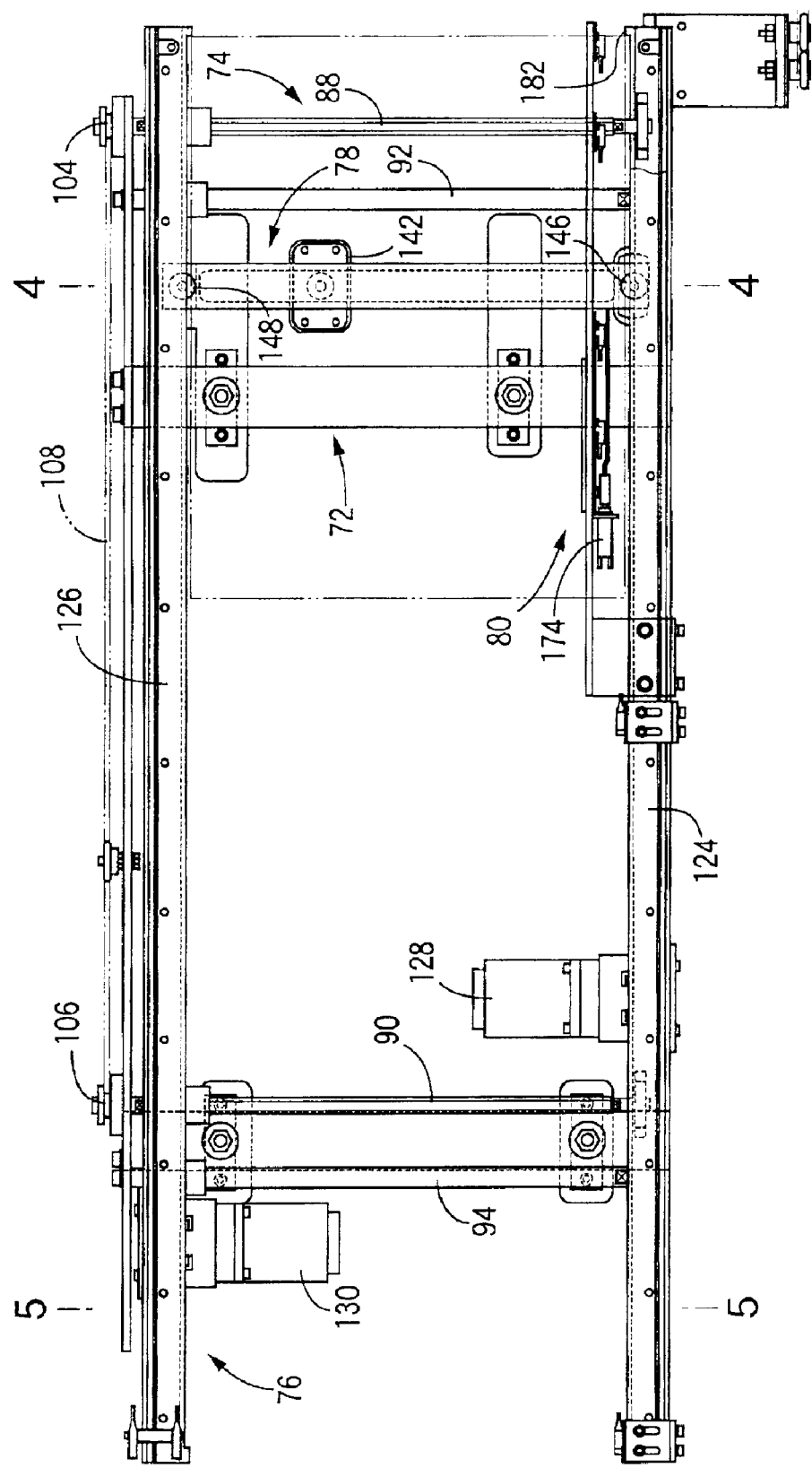
FIG. 2 is a plan view of a horizontal-type substrate loading device which is included in the above-described electronic-component mounting system.

The horizontally loading device 40 includes, in addition to the above-described main bodies 52, 54, a width adjusting device 74, a horizontal movement device 76, a supporting-member elevating device 78 and a horizontal movement stopping device 80. The width adjusting device 74 includes two feed screw mechanisms 88, 90 and two guide rods 92, 94, as shown in FIG. 2. A rotation transmitting device 98 transmits the rotation of a handle 96 which is provided in the horizontally unloading device 46, to the feed screw mechanisms 88, 90. The rotation transmitting device 98 includes a plurality of chains and sprockets which cooperate with each other to transmit the rotation of the handle 96 to the feed screw mechanism 88, and the rotation transmitted to the feed screw mechanism 88 is further transmitted to the feed screw mechanism 90 through a pair of sprockets 104, 106 and a chain 108. The rotations thus transmitted to the feed screw mechanisms 88, 90 cause the movable main bodies to be moved toward and away from the fixed main bodies while being guided by the guide rods 92, 94. Thus, by rotating the handle 96, it is possible to change the spacing distance between the main bodies, as viewed in the width direction, in the horizontally unloading device 46, the horizontally loading device 40, the mounting device 42 and the demounting device 48, simultaneously with each other. In the present embodiment, a drive source of width adjusting device 74 is provided in the horizontally unloading device 46.

Figure 5:
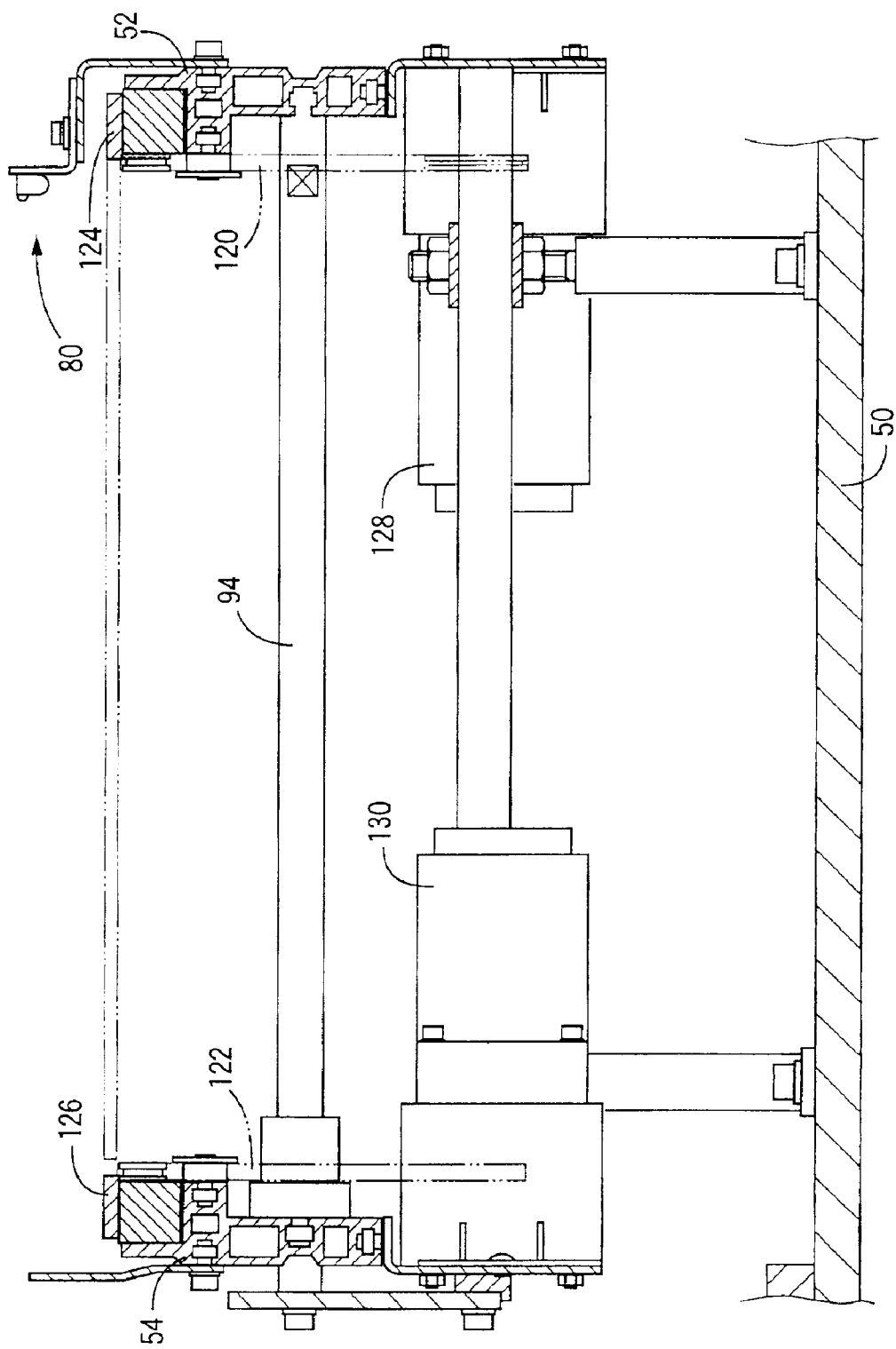
FIG. 5 is a cross sectional view taken along line 5—5 of FIG. 2.

As shown in FIG. 5, the horizontal movement device 76 of the horizontally loading device 40 includes a pair of substrate supporting members in the form of transferring belts 120, 122, guide plates 124, 126 and transferring motors 128, 130. The transferring belt 120 is wound on a pair of pulleys which are rotatably attached to the fixed main body 52, while the transferring belt 122 is wound on a pair of pulleys which are rotatably attached to the movable main body 54. Each of the belts 120, 122 is driven when the pulleys are rotated by the transferring motors 128, 130. Thus, the ceramic substrate 31 supported by the belts 120, 122 is moved in the horizontal direction while being guided by the guide plates 124, 126, so that the ceramic substrate 31 is loaded. Since the transferring motors 128, 130 are driven in synchronization with each other, the pair of belts 120 are moved substantially concurrently with each other at substantially the same velocity.

Figure 4:
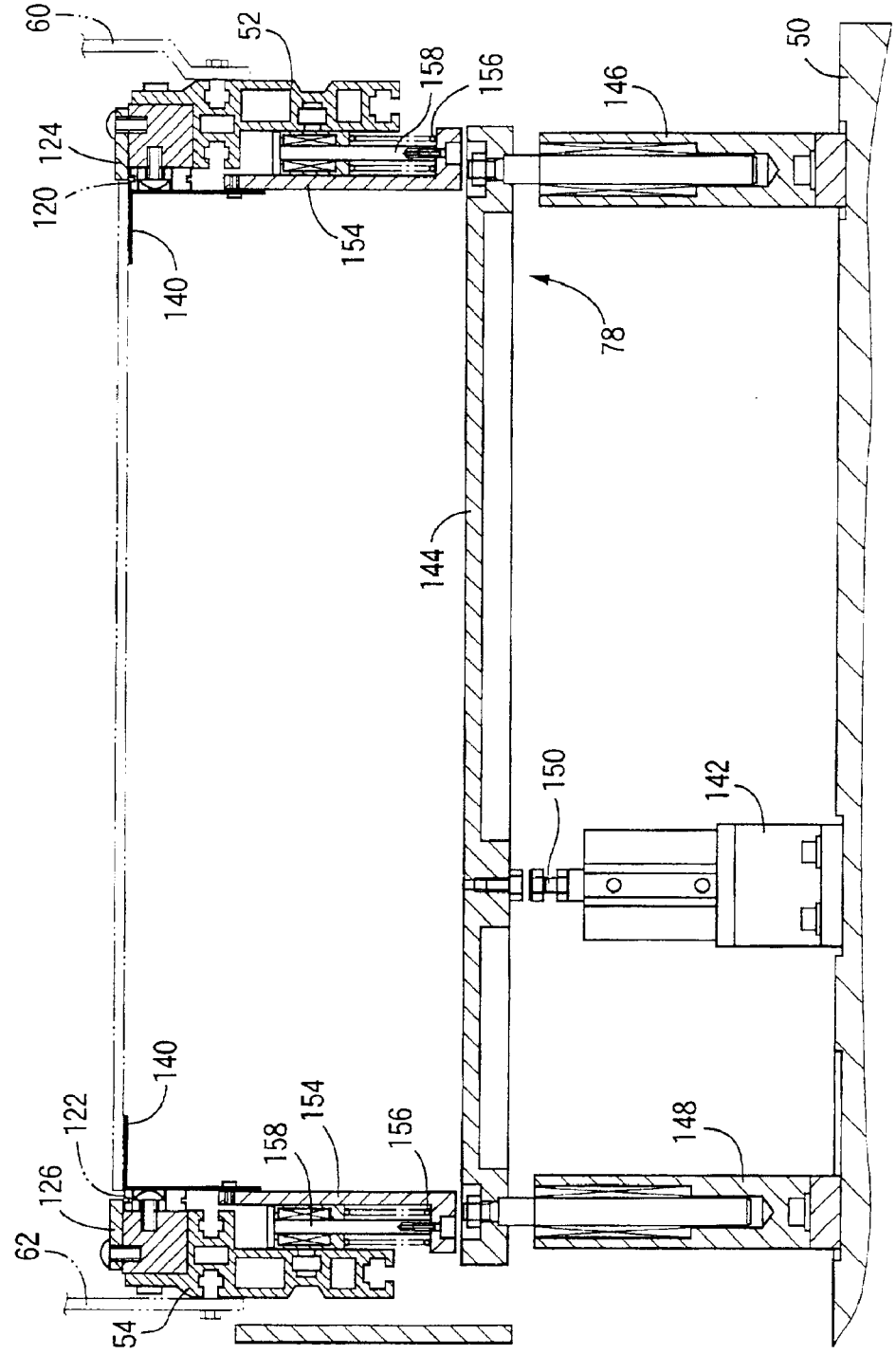
FIG. 4 is a cross sectional view taken along line 4—4 of FIG. 2.

As shown in FIG. 4, the supporting-member elevating device 78 of the horizontally loading device 40 is adapted to elevate and lower substrate supporting members in the form of substrate supporting plates 140. The supporting-member elevating device 78 includes an elevating cylinder 142 and a substrate-supporting-plate elevating member 144. The supporting-member elevating device 78 is provided in a downstream portion of the horizontally loading device 40 as viewed in the transferring direction. The substrate-supporting-plate elevating member 144 extends in a direction perpendicular to the transferring direction. The substrate-supporting-plate elevating member 144 is supported at its opposite end portions by respective guide devices 146, 148, such that its intermediate portion is opposed to a piston rod 150 of the elevating cylinder 142.

When the piston rod 150 is elevated with actuation of the elevating cylinder 142, the substrate-supporting-plate elevating member 144 is elevated while being guided by the guide devices 146, 148. With the elevation of the substrate-supporting-plate elevating member 144, substrate-supporting-plate supporting members 154 are elevated against biasing forces of respective coil springs 156 while being guided by respective guide rods 158. The substrate supporting plates 140 are thus elevated as a result of the elevations of the substrate-supporting-plate supporting members 154.

When the piston rod 150 is lowered, the substrate supporting plates 140 and the substrate-supporting-plate elevating member 144 is lowered owing to the biasing forces of the coil springs 156.

Figure 3:
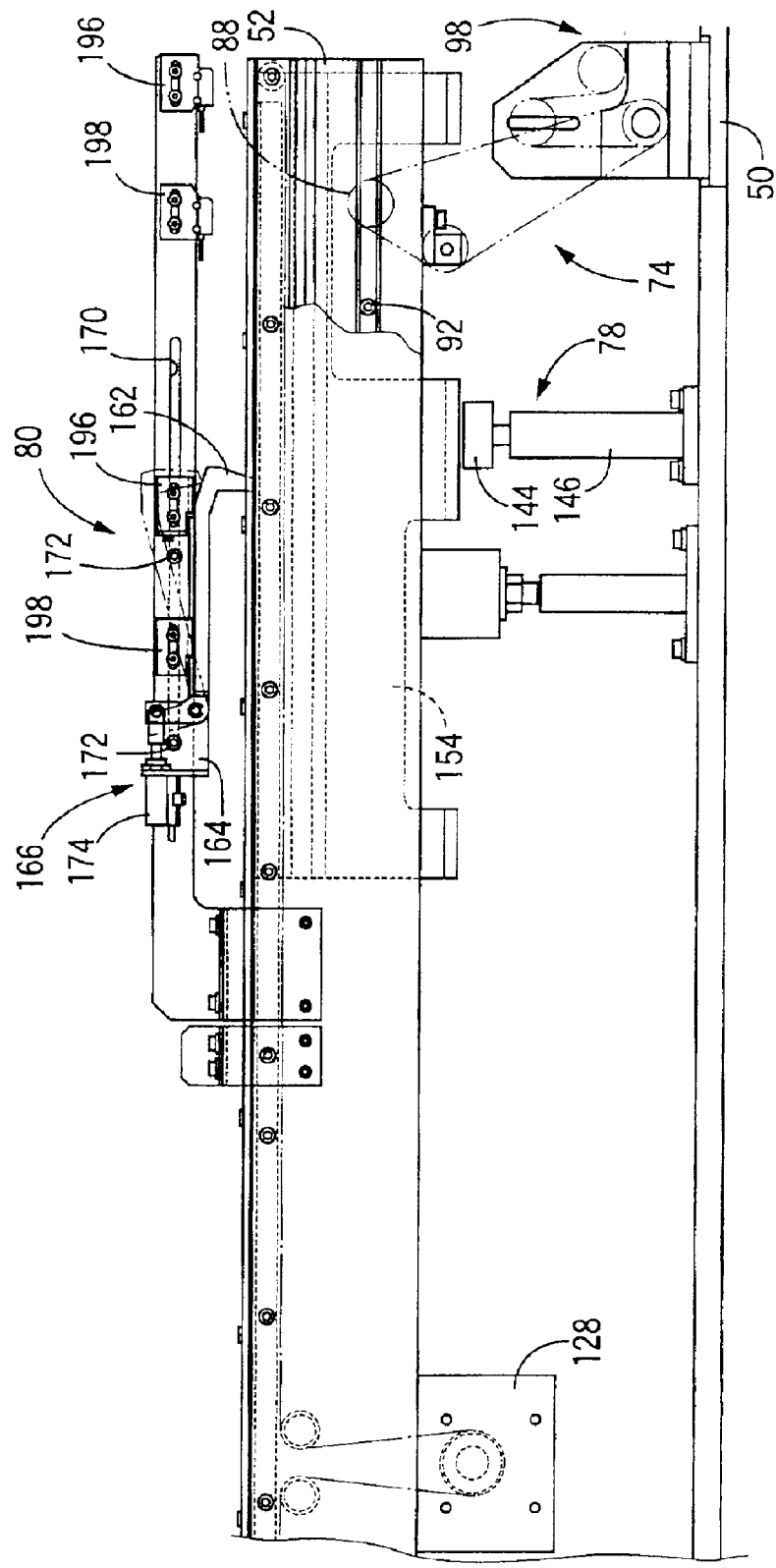
FIG. 3 is a front view of the above-described horizontal-type substrate loading device.

As shown in FIG. 3, the horizontal-movement stopping device 80 of the horizontally loading device 40 is adapted to stop the ceramic substrate 31 in an intermediate portion located between upstream and downstream ends of the horizontally loading device 40 as viewed in the transferring direction. Described specifically, in a case where two or more ceramic substrates 31 are loaded, the stopping device 80 stops the second ceramic substrate 31 or each of the second and following ceramic substrates 31 in a predetermined intermediate position. In the present embodiment, the stopping device 80 is, attached to a portion of the horizontally loading device 40, which portion is changeable. Thus, it is possible to stop the ceramic substrate 31 in a predetermined intermediate position, providing a suitable spacing distance between the ceramic substrate 31 in question and the adjacent ceramic substrate 31. The stopping device 80 includes an intermediate stopper 162, a stopper supporting member in the form of a supporting plate 164, and an intermediate-stopper moving device 166 which is attached to the supporting plate 164 and which moves the intermediate stopper moving device 166 between its operative and inoperative positions. The supporting plate 164 is attached to the main body 52 of the horizontally loading device 40 through attaching devices 172 each of which includes a bolt and a nut. The attached position of the stopping device 80 relative to the main body 52 as viewed in the transferring direction is adjustable within a range corresponding to an elongated hole 170. This attached position of the stopping device 80 is determined depending upon the length of the ceramic substrate 31 as measured in the transferring direction. The intermediate-stopper moving device 166 includes a stopper cylinder 174.

As shown in FIG. 2, a downstream-end stopper 182 as a fixed stopper is provided in a downstream end portion of each of the main bodies 52, 54 of the horizontally loading device 40. The horizontal movement of the ceramic substrate 31, which has been first loaded, is stopped by the downstream-end stopper 182.

When the loading of the ceramic substrate 31 is initiated, the intermediate stopper 162 is positioned in its inoperative position. When the transferring belts 120, 122 are driven, the first ceramic substrate 31 is moved in the horizontal direction. The horizontal movement of the first ceramic substrate 31 is stopped by its abutting contact with the downstream-end stopper 182. Subsequently, the intermediate stopper 162 which is on the upstream side of the first ceramic substrate 31 is moved to its operative position by actuation of the stopper cylinder 174, so that the next ceramic board 31 moved in the horizontal direction by the transferring belts 120, 122 is stopped by the intermediate stopper 162. Meanwhile, the first ceramic substrate 31 brought into abutting contact with the downstream-end stopper 182 is held in stationary. Thus, the two ceramic substrates 31 are supported on the transferring belts 120, 122 such that the two ceramic substrates 31 are spaced apart from each other by a spacing distance that is defined by the intermediate stopper 162.

The horizontally unloading device 46 includes a width adjusting device, a horizontal movement device, a supporting-member elevating device and a horizontal-movement stopping device which are constructed as those of the horizontally loading device 40.

The horizontally loading device 40 includes a plate vertical-stroke-ends sensor 192, a stopper operational-status sensor 194 (see FIG. 13), a substrate in-position sensor 196 (see FIG. 3) and a deceleration sensor 198 (see FIG. 3). The plate vertical-stroke-ends sensor 192 serves to detect whether the substrate supporting plate 140 is positioned in its upper stroke end or lower stroke end. The stopper operational-status sensor 194 serves to detect whether the intermediate stopper 162 is in its operative or inoperative position. The substrate in-position sensor 196 serves to detect whether the ceramic substrate 31 has been positioned in the downstream end or in the position defined by the intermediate stopper 162. The deceleration sensor 198 serves to detect that the ceramic substrate 31 has arrived in positions in which its horizontal movement should be decelerated. The substrate in-position sensor 196 and the deceleration sensor 198 are attached to respective portions of the horizontally loading device 40, which portions are adjustable depending upon the size of the ceramic substrate 31 that is to be transferred. In order that the ceramic substrate 31 moved in the horizontal direction is brought into abutting contact with the intermediate stopper 162 and the downstream-end stopper 182 at a reduced velocity, the transferring motors 128, 130 are controlled such that the horizontal movement of the ceramic substrate 31 is decelerated.

Figure 6:
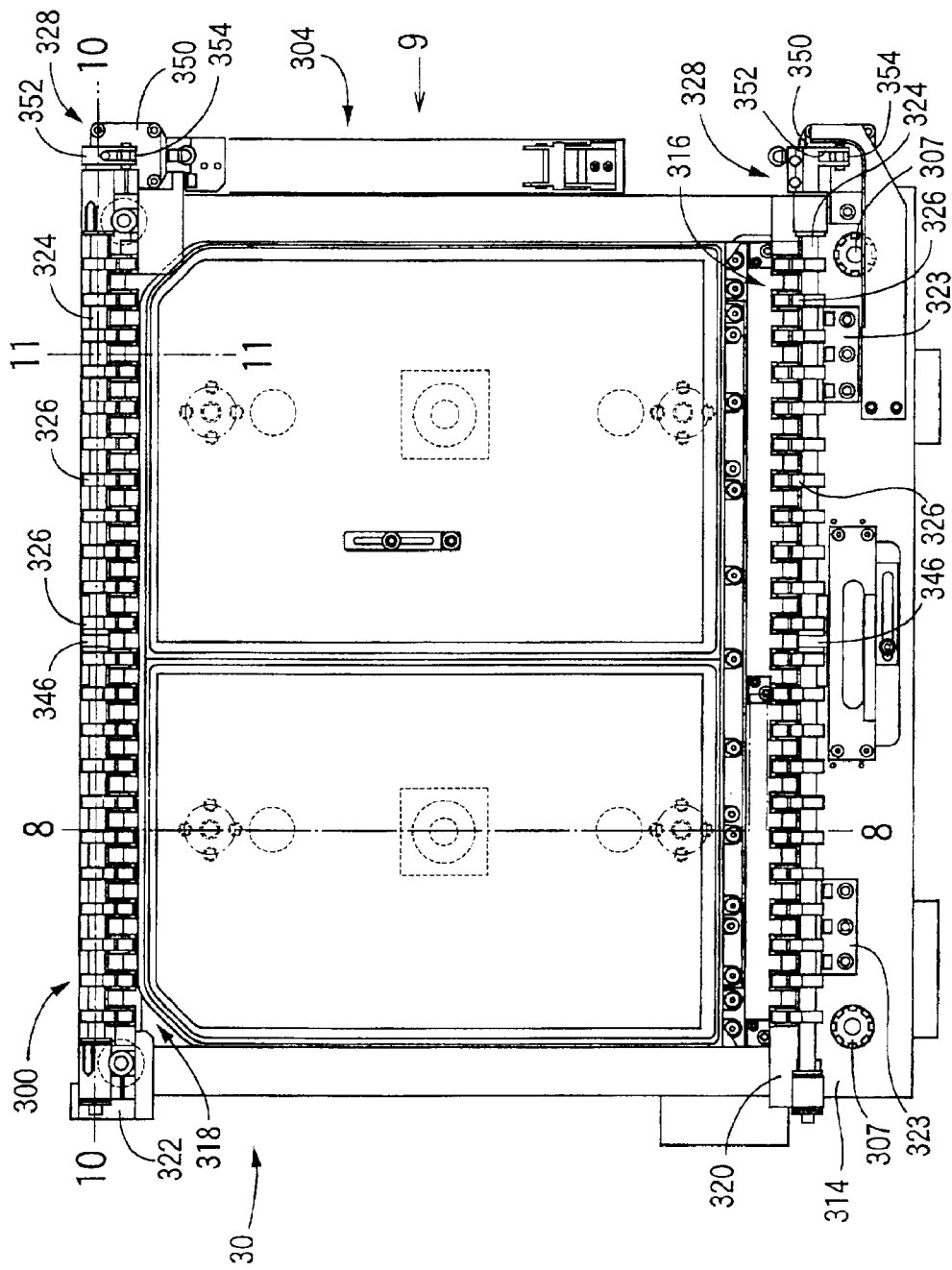
FIG. 6 is a plan view of the substrate holding device included in the above-described electronic-component mounting system.
Figure 7:
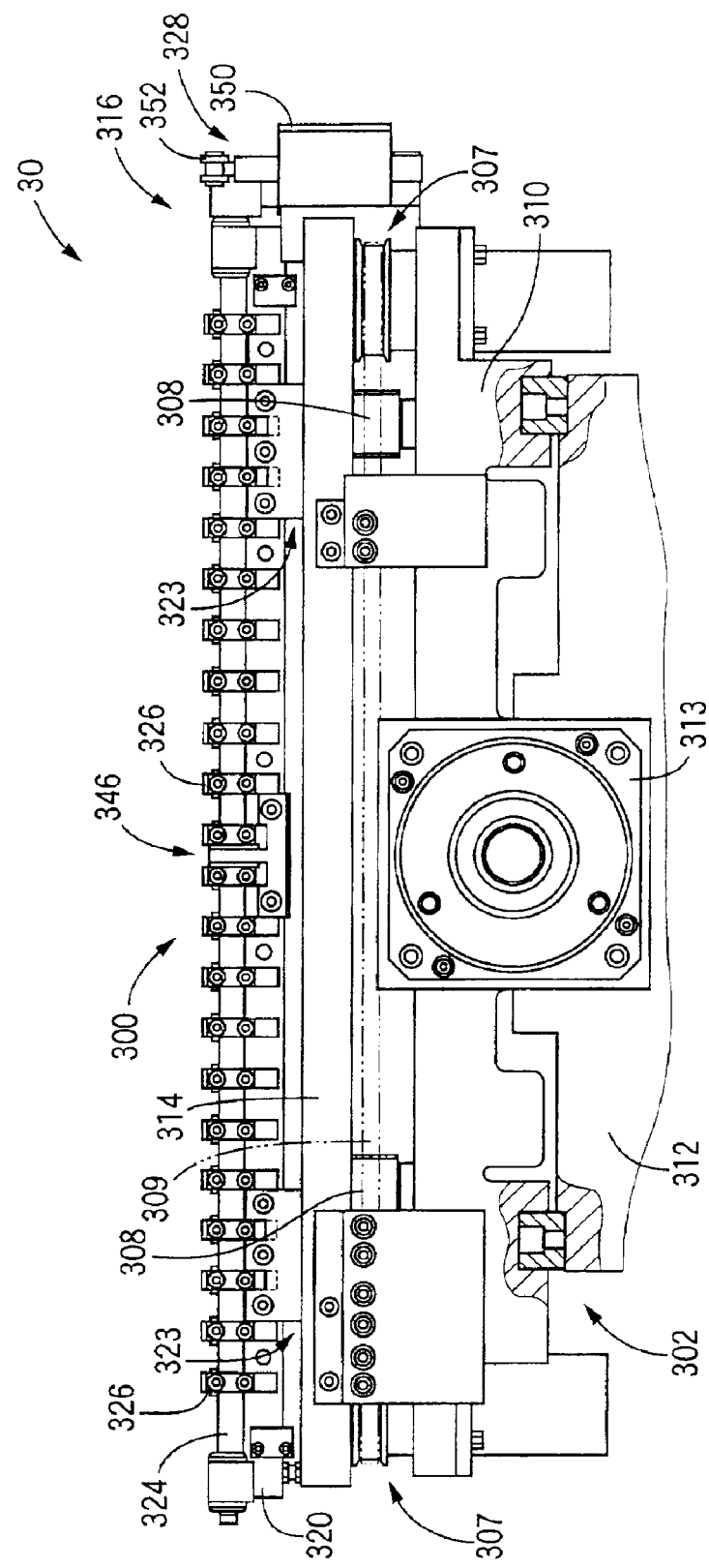
FIG. 7 is a front view of the above-described substrate holding device.

As shown in FIGS. 6 and 7, the substrate holding device 30 includes a substrate holding portion 300 serving as a substrate clamping device, a holding-portion moving device 302, a holding-width adjusting guide device 304 and a holding-portion elevating device. The holding-portion moving device 302 includes a driving motor 313 which moves an X–Y table 312 supporting a main body 310 of the substrate holding device 30. The X–Y table 312 is moved by the driving motor 313 and other driving source, in the transferring direction (i.e., X direction) and the direction (i.e., Y direction) perpendicular to the transferring direction, so that the main body 310 is moved in the X and Y directions.

The main body 310 of the substrate holding device 30 is equipped with the holding-portion elevating device which includes an elevating motor 306 (see FIG. 13), a driving pulley, a feed screw device 307, a plurality of driven pulleys 308 and a timing belt 309 (see FIG. 7), so that a main body 314 of the substrate holding portion 300 is moved relative to the main body 310 of the substrate holding device 30 in the vertical direction. With activation of the holding-portion elevating device, the main body 314 of the substrate holding portion 300 can be positioned in a substrate-mounting level in which the ceramic substrate 31 is loaded from the substrate loading device 36, a substrate-demounting level in which the ceramic substrate 31 is unloaded to the substrate unloading device 38 after the electronic components have been mounted onto the ceramic substrate 31, a horizontal movement level in which the ceramic substrate 31 is horizontally moved, and an electronic-components mounting level in which the electronic components are mounted onto the ceramic substrate 31. The substrate holding portion 300 includes a pair of clamp-type holding portions 316, 318 which have respective main bodies 320, 322. The main body 320 of the holding portion 316 is fixedly attached to the main body 314 of the substrate holding portion 300, while the main body 322 of the holding portion 318 is movably attached to the same 314. Like the horizontally loading device 40, the horizontally unloading device 46, the mounting device 42 and the demounting device 48, the movable main body 322 is moved toward and away from the fixed main body 320 while being guided by the holding-width adjusting guide device 304 which includes guide rails. The fixed main body 320 is fixed to the main body 314 of the substrate holding portion 300 through fixing devices 323, as shown in FIGS. 6 and 7.

The clamp-type holding portion 316 includes the above-described main body 320, a rotary shaft 324 held by the main body 320 such that the rotary shaft 324 is rotatable relative to the main body 320, a plurality of clamping members 326 which are fixed to the rotary shaft 324 such that the clamping members 326 are spaced apart from each other by a suitable spacing distance, and a clamping-member driving device 328 which rotates the rotary shaft 324. Similarly, the clamp-type holding portion 318 includes the above-described main body 322, a rotary shaft 324 held by the main body 322 such that the rotary shaft 324 is rotatable relative to the main body 322, a plurality of clamping members 326 which are fixed to the rotary shaft 324 such that the clamping members 326 are spaced apart from each other by a suitable spacing distance, and a clamping-member driving device 328 which rotates the rotary shaft 324. The clamp-type holding portions 316, 318 are identical with each other except that the holding portion 316 is fixed to the main body 320 while the holding portion 318 is movable relative to the main body 322. Therefore, only the holding portion 318 will be explained, and explanation of the holding portion 316 will not be provided.

Figure 11:
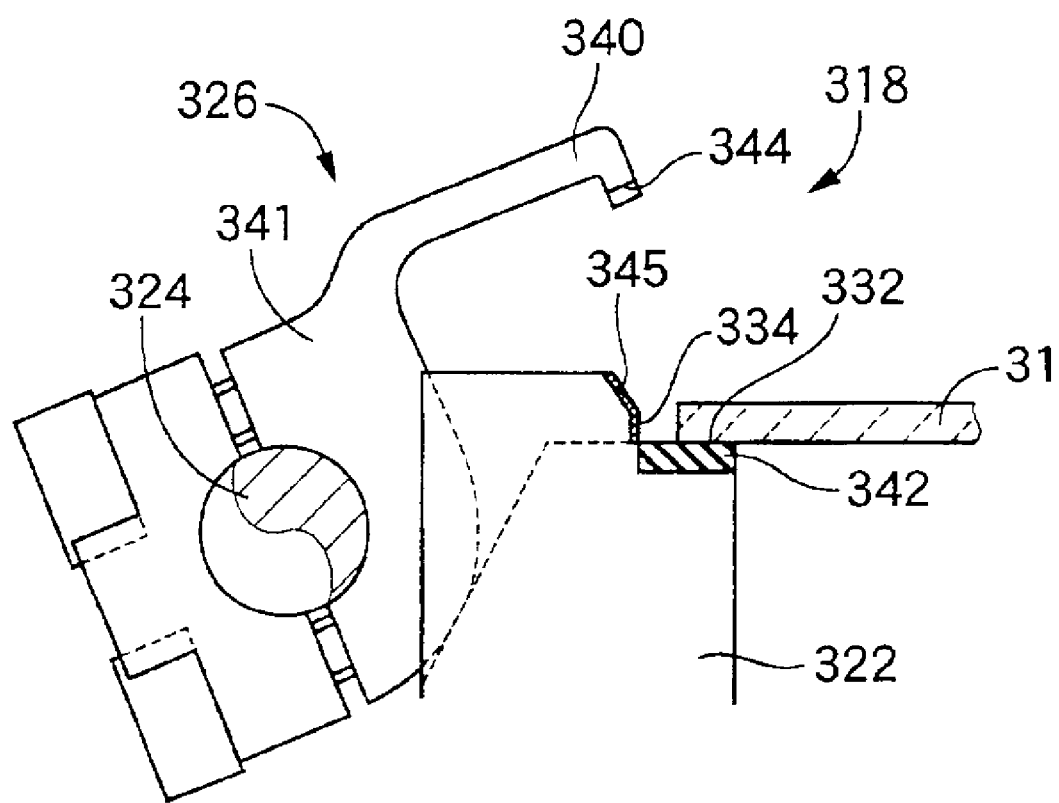
FIG. 11 is a cross sectional view taken along line 11—11 of FIG. 6.

The main body 322 of the clamp-type holding portion 318 is a comb-like body elongated in the transferring direction. As shown in FIG. 11, the main body 322 has a substrate supporting surface 332 which supports a lower surface of the ceramic substrate 31, and a positioning surface 334 which is brought into contact with a widthwise end surface of the ceramic substrate 31 for thereby positioning the ceramic substrate 31 in the widthwise direction. The substrate supporting surface 332 of the main body 320 cooperates with clamping jaws 340 of the clamping members 326 to grip a corresponding one of two portions of the rectangular ceramic substrate 31 which portions are located along two mutually-parallel sides of the rectangular ceramic substrate 31. Each of the clamping members 326 includes the clamping jaw 340, and a main body 341 which is formed integrally with the clamping jaw 340 and which is fitted on the rotary shaft 324 unrotatably and unmovably relative to the rotary shaft 324. The main body 322 and the clamping jaw 340 have respective contact portions which are brought into contact with the ceramic substrate 31. The contact portion of the main body 322 includes the above-described substrate supporting surface 332, while the contact portion of the clamping jaw 340 provides a distal end portion of the clamping jaw 340 which is opposed to the substrate supporting surface 332. These contact portions of the main body 322 and the clamping jaw 340 constitute respective elastically deformable portions 342, 344 each of which is formed of a rubber having a certain degree of electric conductivity. The rubber having the certain degree of electric conductivity is an example of a rubber or its equivalent material that is suitable for forming the elastically deformable portions 342, 344. The provision of the elastically deformable portions 342, 344 makes it possible to avoid stress concentration in a local portion or portions of contact surfaces of the ceramic substrate 31 at which the ceramic substrate 31 is brought into contact with the substrate supporting surface 332 and the clamping jaw 340, and accordingly makes it possible to avoid damaging of the ceramic substrate 31. Further, since the elastically deformable portions 342, 344 are made of the rubber having the electric conductivity, the ceramic substrate 31 can be prevented from being electrified while being clamped. It is noted that a coating layer 345 is formed on the positioning surface 334 and other portion of the main body 322, so that the main body 322 has an improved degree of wear resistance. In the present embodiment, the coating layer 345 is provided by a diamond coating (DLC).

Figure 9:
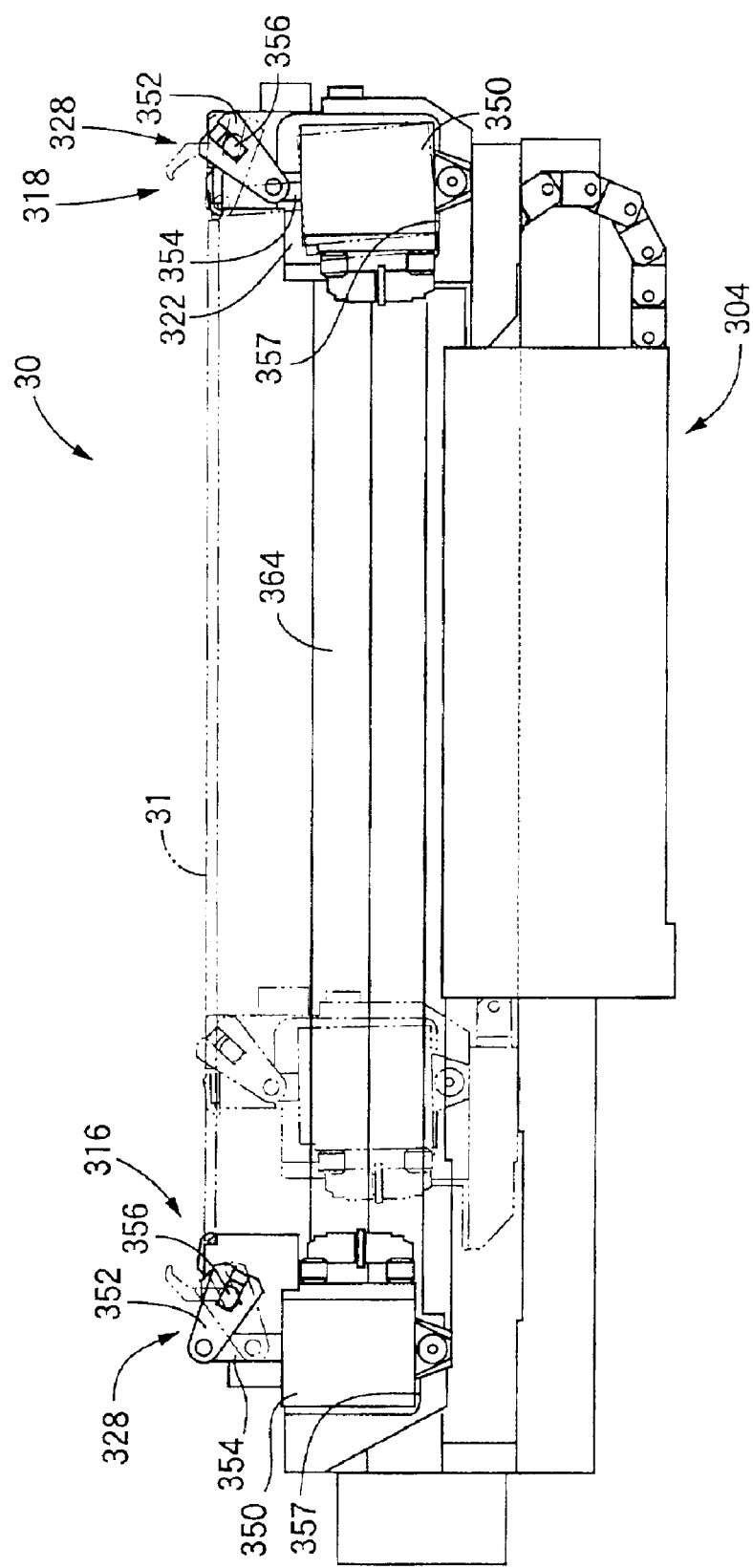
FIG. 9 is a view taken in the direction of arrow 9.
Figure 10:
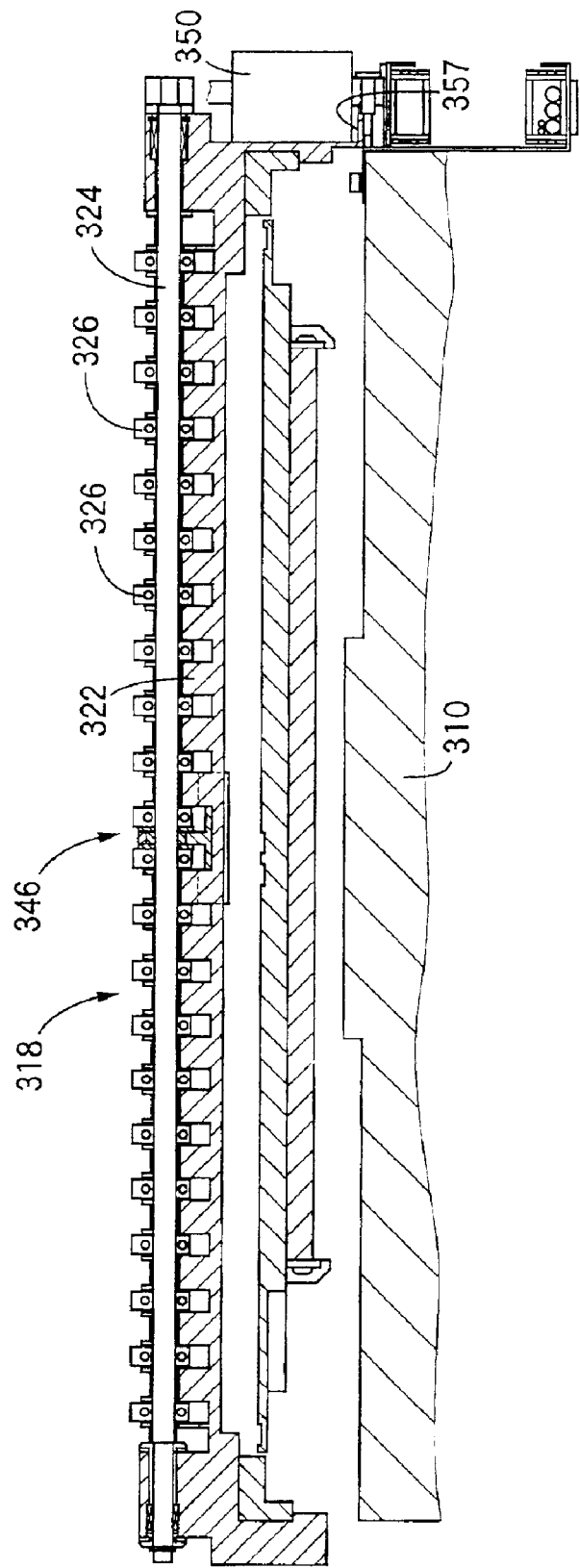
FIG. 10 is a cross sectional view taken along line 10—10 of FIG. 6.

The rotary shaft 324 is supported at its opposite end portions by the main body 322 such that the rotary shaft 324 is rotatable relative to the main body 322, and is supported at its intermediate portion by the main body 322 via a bearing 346. The clamping-member driving device 328 is provided in one of opposite end portions of the main body 322. As shown in FIG. 9, the clamping-member driving device 328 includes a clamp cylinder 350 as an actuator, and a drive lever 352. As is apparent from FIG. 12 which schematically shows its construction, the clamp cylinder 350 includes a cylindrical housing, a piston 353 that is slidably movable within the cylindrical housing, and a piston rod 354 that protrudes from the piston 353 outwardly of the cylindrical housing. The piston rod 354 has a distal end portion to which an end portion of the drive lever 352 is attached such that the drive lever 352 is pivotable relative to the piston rod 354. The other end portion of the drive lever 352 is engaged with the rotary shaft 324. That is, one 356 of the opposite end portions of the rotary shaft 324 has two mutually-parallel surfaces, so that the end portion 356 of the rotary shaft 324 is gripped by the other end portion of the drive lever 352. When the piston rod 354 is moved in the vertical direction with actuation of the clamp cylinder 350, the drive lever 352 is pivoted about the axis of the rotary shaft 324 whereby the rotary shaft 324 is rotated. With the rotation of the rotary shaft 324, the substrate holding portion 300 as the substrate clamping device is switched between its clamping position and unclamping position. In the holding portion 318, each clamping jaw 340 is moved to its clamping position when the piston rod 354 is retracted (as indicated by the solid lines in FIG. 9), while each clamping jaw 340 is moved to its unclamping position when the piston rod 354 is extended (as indicated by the two-dot chain lines in FIG. 9). In the holding portion 316, on the other hand, each clamping jaw 340 is moved to its clamping position when the piston rod 354 is extended (as indicated by the solid lines in FIG. 9), while each clamping jaw 340 is moved to its clamping position when the piston rod 354 is retracted (as indicated by the two-dot chain lines in FIG. 9). Since the clamp cylinder 350 is attached to the main body 322 such that the clamp cylinder 350 is pivotable relative to the main body 322, it is possible to clamp the ceramic substrate 31 with a substantially constant force even if the thickness of the ceramic substrate 31 is variable. Further, the pivot movement of the clamp cylinder 350 assures smooth movement of the piston rod 354 relative to the cylindrical housing. As shown in FIGS. 9 and 10, the clamp cylinder 350 is attached to the main body 322 such that its portion is accommodated in an accommodating portion formed in the main body 322, so that the pivot movement of the clamp cylinder 350 is limited by an inner surface 357 of the accommodating portion.

Figure 12:
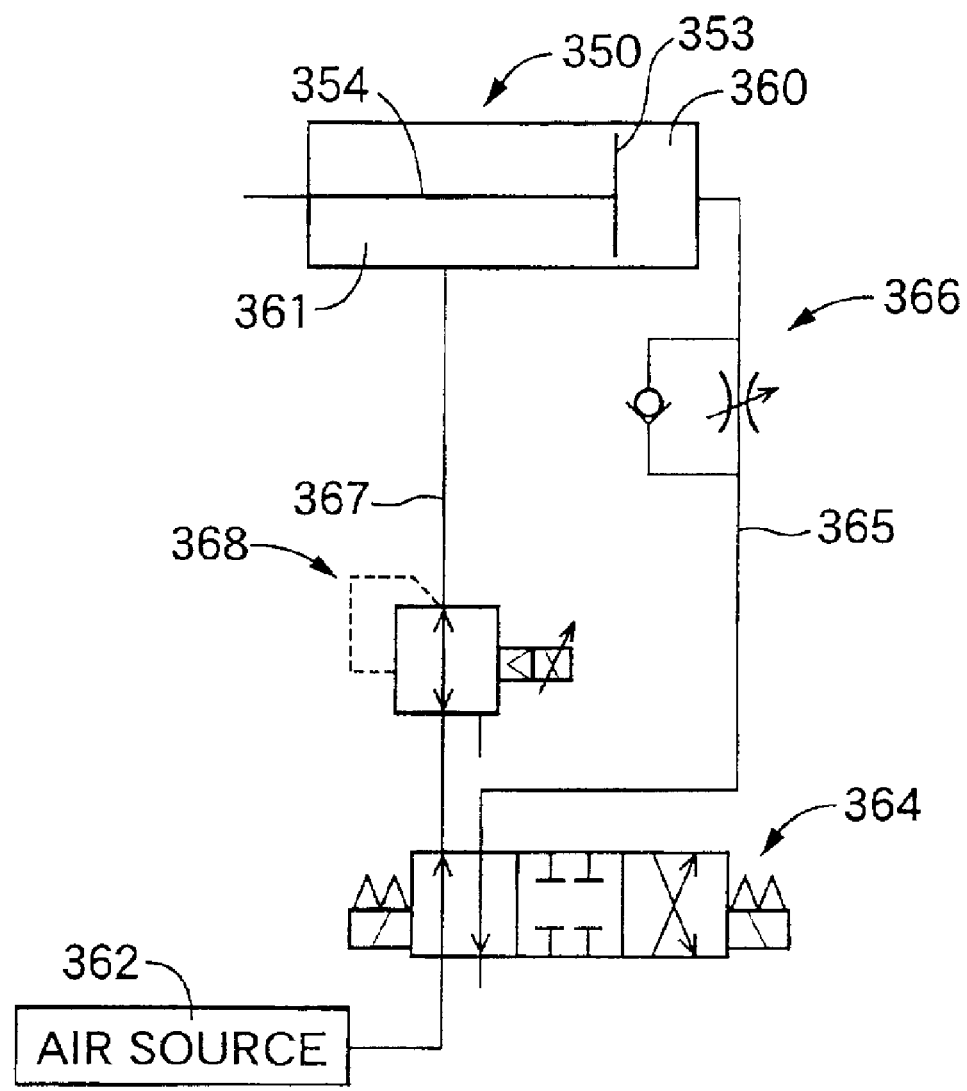
FIG. 12 is a circuit diagram indicating a control circuit of a clamp cylinder which is an element of the above-described substrate holding device.

Each of the clamp cylinders 350 is a double acting cylinder, as shown in FIG. 12 which illustrates one of the clamp cylinders 350 constitutes the holding portion 318. A selected one of two solenoids of an electromagnetically-operated directional control valve 364 is energized so that an air is supplied from an air source 362 to a selected one of a head-side chamber 360 and a rod-side chamber 361 while the air is discharged from the other of the chambers 360, 361, whereby the piston rod 354 is extended and retracted for pivoting the drive lever 352. A variable flow regulator valve 366 is provided in an air passage 365 which communicates the head-side chamber 360 with the air source 362, while an electromagnetically-operated proportional control valve 368 is provided in an air passage 367 which communicates the rod-side chamber 361 with the air source 362. Since the above-described electromagnetically-operated directional control valve 364, the variable flow regulator valve 366 and the electromagnetically-operated proportional control valve 368 are provided by known valves, their detail explanations are not provided. A portion of the air passage 365 in which the variable flow regulator valve 366 is provided has a cross section whose area is variable by varying an amount of electric current supplied to a solenoid of the variable flow regulator valve 366. That is, by varying the amount of the supplied electric current, it is possible to vary a flow rate of the air flowing through the air passage 365. Thus, it is possible to control the flow rate of the air discharged from the head-side chamber 360 of the clamp cylinder 350, and to control the flow rate of the air supplied to the rod-side chamber 361, thereby controlling an actuation velocity of the clamp cylinder 350, namely, controlling a velocity of movement of the clamping jaw 340 toward its clamping position. A valve opening pressure of the electromagnetically-operated proportional control valve 368 can be varied by varying an amount of electric current supplied to a solenoid of the proportional control valve 368. Thus, it is possible to control a pressure value of the air supplied to the rod-side chamber 361 of the clamp cylinder 350, thereby controlling an actuation force of the clamp cylinder 350, namely, controlling a clamping force of the clamping jaw 340. The clamping force of the clamping jaw 340 may be changed suitably depending upon the thickness and material of the ceramic substrate 31. In the present embodiment, the clamping force is controlled to be equalized to a selected one of a plurality of different amounts which are predetermined for a plurality of kinds of ceramic substrates 31. It is noted that the variable flow regulator valve 366 provided in the air passage 365 may be replaced with a variable flow regulator valve which is provided between the proportional control valve 368 and the rod-side chamber 36 in the air passage 367. Also in this modified arrangement, the flow rate of the air supplied to the rod-side chamber 361 can be controlled. In the holding portion 316 whose control circuit for controlling the clamp cylinder 350 is not illustrated, the electromagnetically-operated proportional control valve 368 is provided in the air passage 365 which communicates the head-side chamber 360 with the air source 362, while the variable flow regulator valve 366 is provided in the air passage 367 which communicates the rod-side chamber 361 with the air source 362. This control circuit of the holding portion 316 may be modified such that a variable flow regulator valve and an electromagnetically-operated proportional control valve are provided in the air passage 365 and such that the proportional control valve is positioned between the variable flow regulator valve and the air source 362. The control circuit of the holding portion 316 is different from that of the holding portion 318 only in the arrangements of the variable flow regulator valve and the proportional control valve, but is similar with that of the holding portion 318 in that the movement velocity and the clamping force of the clamping jaw 340 are controlled.

Figure 8:
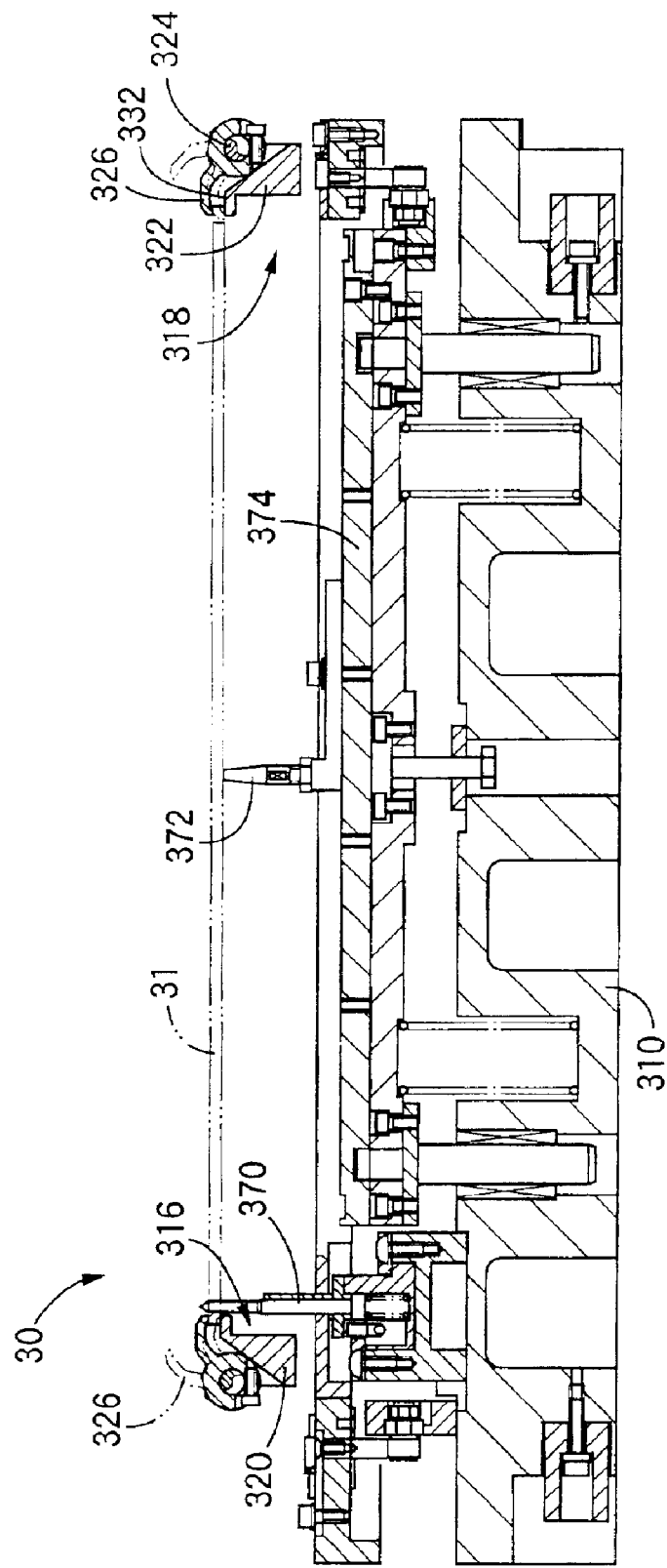
FIG. 8 is a cross sectional view taken along line 8—8 of FIG. 6.

When the ceramic substrate 31 is clamped by the clamp-type holding portions 316, 318 of the substrate holding portion 300, a positioning pin 370 is introduced in a hole formed through the ceramic substrate 31 while a backup pin 372 as a supporting member is held in contact with a surface (supported surface) of the ceramic substrate 31 that is opposite to a surface (work surface) onto which the electronic components are to be mounted, as shown in FIG. 8. The backup pin 372 is fixed to a pin supporting member 374 which is also adapted to be vertically movable.

Figure 13:
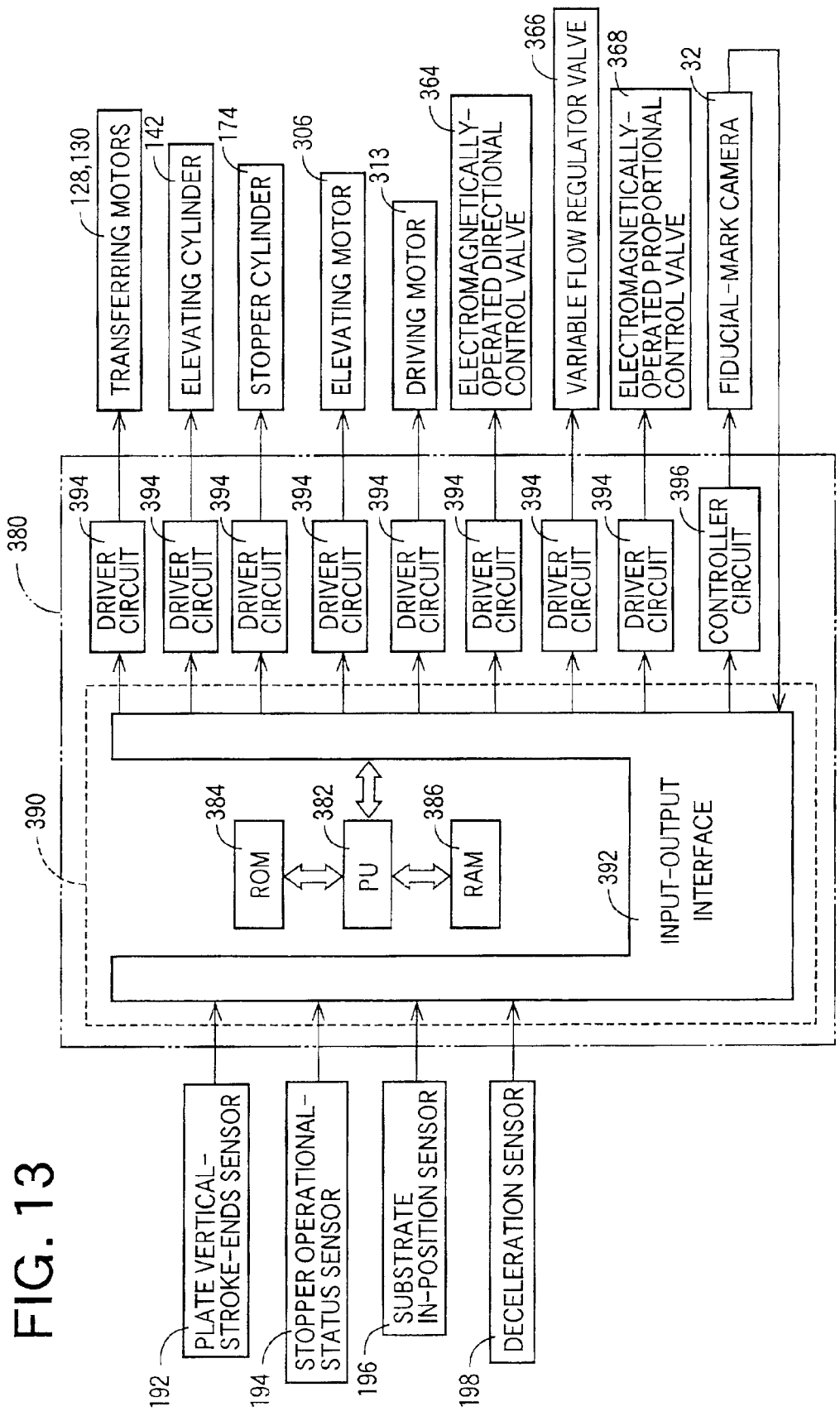
FIG. 13 is a block diagram schematically showing portions of a control device which controls the above-described electronic-component mounting system, which portions relate to the present invention.

The present electronic-component mounting system is controlled by a control device 380 which is shown in FIG. 13. The control device 380 is principally constituted by a computer 390 including a processing unit (PU) 382, a read only memory (ROM) 384, a random access memory (RAM) 386 and a bus interconnecting those elements 382, 384 and 386. To the bus, there is connected an input-output interface 392 to which are connected various sensors such as the plate vertical-stroke-ends sensor 192, the stopper operational-status sensor 194, the substrate in-position sensor 196 and the deceleration sensor 198. To the input-output interface 392, there are also connected the transferring motors 120, 122, the solenoids of (the control valve of) the elevating cylinder 142 and (the control valve of) the stopper cylinder 174, the elevating motor 306, the driving motor 313, and the solenoids of the electromagnetically-operated directional control valve 364, the variable flow regulator valve 366 and the electromagnetically-operated proportional control valve 368 of the clamp cylinder 350, through respective driver circuits 394. To the input-output interface 392, there are also connected the fiducial-mark camera 32 through a controller circuit 396.

In the electronic-component mounting system constructed as described above, the ceramic substrate 31 is loaded to the substrate holding device 30 by the substrate loading device 36. While the ceramic substrate 31 is supported by the substrate supporting surfaces 332 of the respective main bodies 320, 322 of the substrate holding device 30, the clamping jaws 340 are pivoted with activations of the clamping-member driving devices 328, whereby the clamping jaws 340 are brought into contact with the ceramic substrate 31. In this instance, the ceramic substrate 31 are gripped at its opposite surfaces by the elastically deformable portions 342 of the substrate supporting surfaces 332 and the elastically deformable portions 344 of the clamping jaws 340, whereby the ceramic substrate 31 is fixed to the substrate holding device 30. The substrate holding portion 300 is movable together with the X-Y table 312 in the transferring direction (X-axis direction) and the direction (Y-axis direction) perpendicular to the transferring direction, so that the main body 310 of the substrate holding portion 300 can be moved in the X-axis and Y-axis directions. The substrate holding portion 300 can be moved to be positioned in the electronic-component mounting position in which the electronic-component mounting device 12 is operated to mount the electronic components onto the ceramic substrate 31 supported by the substrate holding portion 300, whereby a printed circuit board as the electric circuit is fabricated.

The movement velocity of the clamping members 326 is controlled by the control device 380 which controls the flow rate of the air supplied to the clamp cylinder 350. Described specifically, the cross sectional area of the air passage of the variable flow regulator valve 366 is reduced in a final stage of forward movement of the clamping members 326 toward the ceramic substrate 31, for thereby controlling the flow rate of the air supplied to the rod-side chamber 361 so that the forward movement velocity of the clamping members 326 is gradually reduced. Owing to the gradual reduction in the forward movement velocity of the clamping members 326, the clamping jaws 340 can be brought into contact with the ceramic substrate 31 at a reduced velocity. Further, the control device 380 controls the pressure of the air supplied to the clamp cylinder 350, on the basis of the material and thickness of the ceramic substrate 31, such that a suitable load is applied to the ceramic substrate 31 upon the contact of the clamping members 326 with the ceramic substrate 31.

In the present embodiment, the substrate supporting surface 332 of each of the main bodies 320, 322 as a receiving member and each of the clamping jaws 340 as a movable member have respective contact portions which are brought into contact with the ceramic substrate 31. Since the contact portions of the substrate supporting surface 332 and the clamping jaw 340 are provided by the elastically deformable portions 342, 344, respectively, which are formed of a rubber or its equivalent material having a certain degree of electric conductivity, it is possible to appropriately hold the ceramic substrate 31, i.e., a kind of fragile-material-made circuit substrate that is easily damaged, without a risk of damaging of the substrate 31. Further, the clamp cylinder 350 as an actuator serving to pivot the clamping jaws 340 is controlled in such a manner that reduces the velocity of the movement of the elastically deformable portions 344 toward the substrate supporting surface 332, thereby making it possible to reduce the load applied to the ceramic substrate 31 upon contact of the clamping jaws 340 and the substrate supporting surface 332 with the ceramic substrate 31. This reduction in the movement velocity of the clamping jaws 340 also contributes to the prevention of damaging of the ceramic substrate 31. Still further, the pressure of the of the air supplied to the clamp cylinder 350 is controlled on the basis of the material and size of the ceramic substrate 31 such that a suitable load is applied to the ceramic substrate 31 upon the contact of the clamping jaws 340 with the ceramic substrate 31, whereby the ceramic substrate 31 can be held with a suitable force.

In the present embodiment, the variable flow regulator valve 366 cooperates with a portion of the control device 380, which portion functions as a regulating device to regulate the variable flow regulator valve 366 in the final stage of the above-described forward movement (which portion constitutes a velocity reducing portion for reducing the movement velocity of the clamping jaws 340 in the final stage of the forward movement), to constitute an air-flow-rate controlling device as a kind of movement-velocity controlling device. Further, the electromagnetically-operated proportional control valve 368 cooperates with a portion of the control device 380, which portion controls the solenoid of the proportional control valve 368, to constitute an air-pressure controlling device as an actuation-force controlling device. It is noted that a damaging of a fragile-material-made substrate such as the ceramic substrate can be prevented to some degree even where the substrate holding device is provided with at least one of the arrangement that the elastically deformable portions are provided in the movable and receiving members, the arrangement that the movement velocity of the movable member is reduced in the final stage of its forward movement, and the arrangement that the air pressure is controlled such that a suitable load is applied to the ceramic substrate upon the contact of the movable member with the ceramic substrate. It is also noted that the actuator for actuating the clamping jaws 340 can be provided by an electric motor in place of the air cylinder. However, where the actuator is provided by the air cylinder as in the present embodiment, it is possible to reduce a required cost more satisfactorily than where the actuator is provided by the electric motor.

Like the positioning surfaces 334 of the main bodies 320, 322, side surfaces of the main bodies of the horizontally loading device 38 and the horizontally unloading device 40, i.e., guide surfaces for guiding the ceramic substrate 31 may be coated with a diamond coating, so that the guide surfaces have an improved degree of wear resistance. Further, at least one of the intermediate stopper 162 and the downstream-end stopper 182 may be provided with an elastically deformable portion, like the above-described elastically deformable portions 342, 344, which is formed of an electrically-conductive rubber or its equivalent material, for thereby alleviating an impact generated upon contact of the stopper 162 and/or stopper 188 with the ceramic substrate 31 so as to avoid damaging of the ceramic substrate 31.

Figure 14:
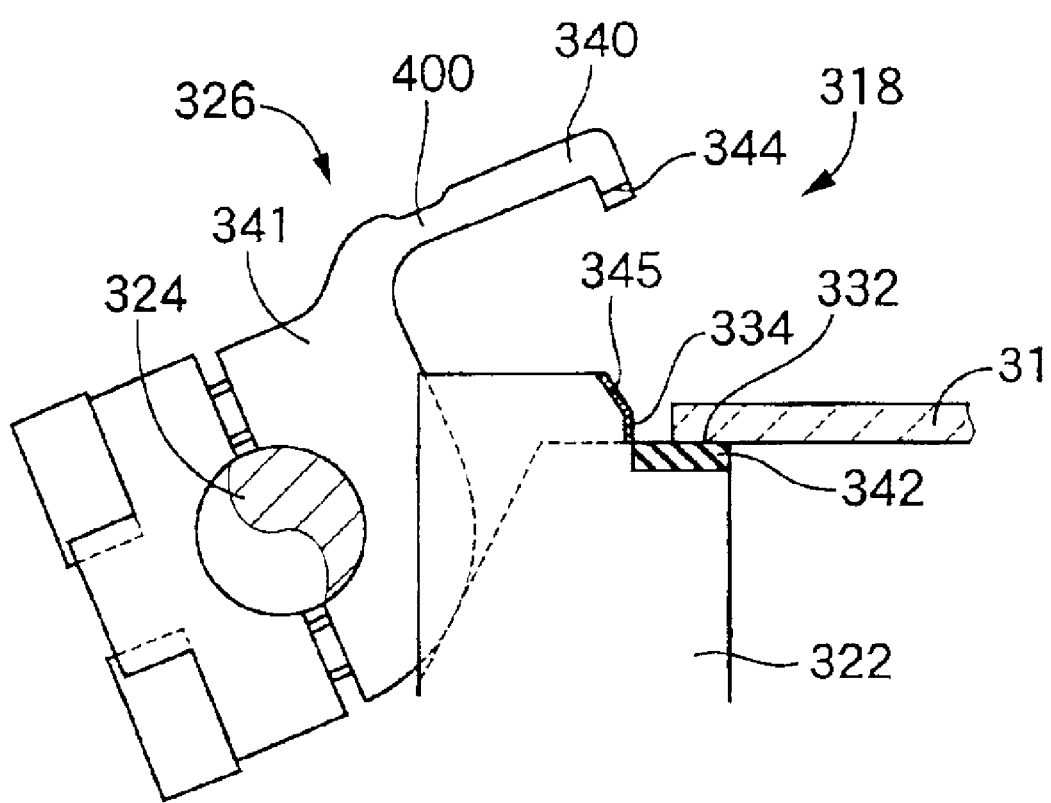
FIG. 14 is a side view (partially in cross section) of a movable member and a receiving member which are elements of a substrate holding device constructed according to another embodiment of the present invention.

As shown n FIG. 14, each of the clamping jaws 340 may include a thickness reduction portion 400 which has a smaller thickness than the other portion of the clamping jaw 340. The thickness reduction portion 400 is provided by a connecting portion in which the clamping jaw 340 is connected with the main body portion 341, namely, provided by a proximal end portion of the clamping jaw 340 that is opposite to a distal end portion of the clamping jaw 340 in which the elastically deformable portion 344 is provided. The thickness reduction portion 400 is effective to further reduce a load applied to the ceramic substrate 31 upon the contact of the clamping jaw 340 with the ceramic substrate 31, thereby making it possible to more satisfactorily hold the ceramic substrate 31 without a risk of damaging of the ceramic substrate 31.

The supporting member for supporting the lower surface of the ceramic substrate 31 may be provided by a plurality of substrate supporting members 410, 412 which are formed of a rubber or its equivalent material, as shown in FIGS. 15–18. The supporting members 410, 412 are described in detail in the specification of the co-pending U.S. patent application Ser. No. 10/104,037. In the present embodiment, each of the supporting members 410, 412 is formed of a vibration damping rubber. Described specifically, the vibration damping rubber has a loss factor or loss tangent tan □ not smaller than 0.5, as measured when the rubber is subjected to vibration of 110 Hz at a temperature of 20° C. This vibration damping rubber exhibits an excellent impact and vibration absorbing ability, and reacts little to an external force applied thereto so as to absorb the external energy. As such a vibration damping rubber, it is possible to employ a commercially available damping rubber (e.g., "HANENITE" manufactured by NAIGAI Co., Ltd.). This vibration damping rubber has physical properties and durability comparable to those of standard rubbers, and exhibits an excellent vibration damping ability at an ordinary temperature range (5–35° C.), and an impact resilience smaller than 10%. Further, this vibration damping rubber has a high degree of moldability as standard rubbers, and is firmly adherable to a metal member. Still further, where this vibration damping rubber is provided in the form of a sheet, it can be easily cut, blanked or punched.

Figure 15:
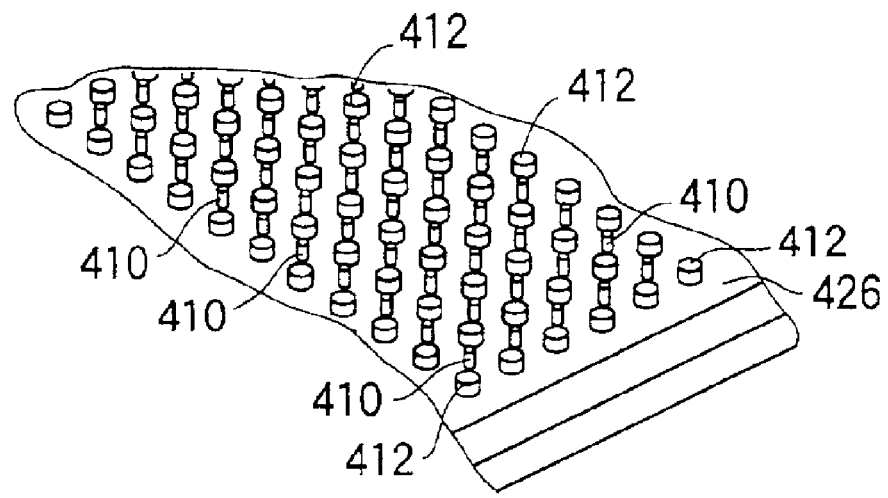
FIG. 15 is a perspective view of substrate supporting members which are elements of a substrate holding device constructed according to still another embodiment of the present invention.
Figure 16:
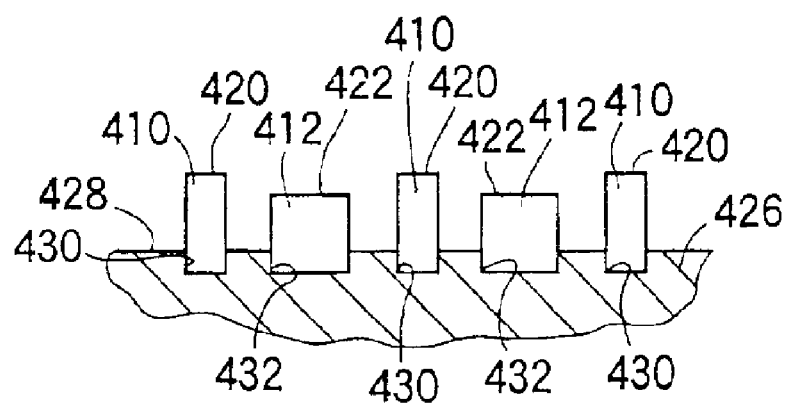
FIG. 16 is a front view in cross section of the above-described substrate supporting members.

Each of the supporting members 410, 412 consists of a vertically extending columnar member whose cross sectional shape is constant as viewed in its axial direction, as shown in FIG. 16. Each supporting member 412 has a diameter larger than that of each supporting member 410, and a smaller height (axial length) than that of each supporting member 410. Each supporting member 410 and each supporting member 412 have respective upper end surfaces 420, 422. Each supporting member 412 is adapted to have a compression modulus higher than that of each supporting member 410. In the present embodiment, the material forming each supporting member 412 has a higher degree of hardness than the material forming each supporting member 410 so that the compression modulus of each supporting member 412 is made larger than that of each supporting member 410. As shown in FIG. 16, the supporting members 410, 412 are regularly arranged on a holding surface 428 which is provided by an upper surface of a holding plate 426 (and which is to be brought parallel with the lower surface of the ceramic substrate 31), such that each of the supporting members 410 is adjacent to a corresponding one of the supporting members 412. In the present embodiment, the holding surface 428 has a plurality of sections in the supporting members 410, 412 are arranged in accordance with a predetermined pattern, so that the plurality of sections of the holding surface 428 have the same arrangement of the supporting members 410, 412. Described more specifically, the supporting members 410, 412 are arranged on the holding surface 428 in a zigzag or staggered pattern, as shown in FIG. 15. However, the supporting members 410, 412 do not have to be arranged necessarily in the staggered pattern, but may be otherwise arranged depending upon the substrate to be supported. The holding plate 426, on which the supporting members 410, 412 are arranged, is fixed to the pin supporting member 374, such that the holding plate 426 is positioned in a predetermined position. Each of the supporting members 410, 412 does not have to be necessarily formed of the vibration damping rubber, but may be formed of other material such as a foamed material.

The supporting members 410, 412 may be fixed to the holding plate 426 by a boding agent or other suitable means. In the present embodiment, the holding plate 426 has a plurality of receiving holes 430, 432 which are formed in the holding surface 428, as shown in FIG. 16, such that the receiving holes 430, 432 are arranged in a staggered pattern. Each of the receiving holes 430 has an inside diameter which is smaller than that of each of the receiving holes 432 and which is slightly larger than the outside diameter of each of the supporting members 410. Each of the receiving holes 432 has an inside diameter which is slightly larger than the outside diameter of each of the supporting members 412. The supporting members 410, 412 are fitted, at their respective proximal end portions, into the receiving holes 430, 432, with the proximal end portions being bonded to the receiving holes 430, 432, whereby the supporting members 410, 412 are fixed to the holding plate 426. It is noted that the supporting members 410, 412 may be press-fitted into the receiving holes 430, 432, so that the supporting members 410, 412 can be fixed to the holding plate 426 without using a boding agent.

Figure 17:
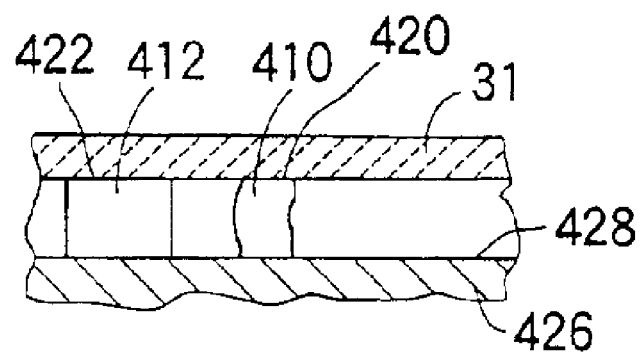
FIG. 17 is a front view in cross section showing a status in which a ceramic substrate is supported by the above-described substrate supporting members.
Figure 18:
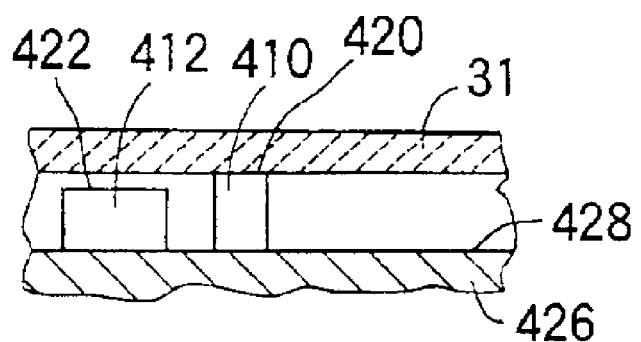
FIG. 18 is a front view in cross section showing another status in which the ceramic substrate is supported by the above-described substrate supporting members.

The ceramic substrate 31 can be reliably supported by the supporting members 410, 412, even where the ceramic substrate 31 is upwardly or downwardly convexed. Where the lower surface of the ceramic substrate 31 is substantially flat, or where the lower surface is downwardly convexed as shown in FIG. 17, the ceramic substrate 31 is supported at the lower surface by the upper end surfaces 420, 422 of the supporting members 410, 412, with the supporting members 410 being elastically compressed. In this instance, both of the upper end surfaces 420, 422 of the supporting members 410, 412 are held in contact with the lower surface of the ceramic substrate 31. Where the ceramic substrate 31 is upwardly convexed as shown in FIG. 18, on the other hand, the ceramic substrate 22 is supported at the lower surface by the upper end surfaces 420 of the supporting members 410. In this instance, only the upper end surfaces 420 of the supporting members 410 are held in contact with the lower surface of the ceramic substrate 31.

The ceramic substrate 31 tends to be subjected to vibration, for example, when the electric component is brought into abutting-contact with the ceramic substrate 31 as a result of the downward movement of the suction head, or when the ceramic substrate 31 is moved and stopped by the X–Y table 312. However, the vibration applied to the ceramic substrate 31 is damped or absorbed, whereby the ceramic substrate 31 is prevented from being vibrated, or vibration of the ceramic substrate 31 is rapidly settled or stopped even if the ceramic substrate 31 is somewhat vibrated. That is, the ceramic substrate 31 is not vibrated at least at a point of time at which the electric component is mounted onto the upper surface of the ceramic substrate 31, whereby the electric component is mounted in a desired spot of the upper surface with high accuracy. Further, the ceramic substrate 31 can be brought into contact at the lower surface with the supporting members 410, 412, without a large compressive stress being concentrated in a local portion of each of the upper end surfaces 420, 422 of the supporting members 410, 412, whereby the lower surface of the ceramic substrate 31 is reliably positioned in a desired position, making it possible to accurately mount the electric component on the upper surface of the ceramic substrate 31 without a risk of failure in mounting of the electric component onto the ceramic substrate 31. The supporting members 410, 412 are capable of supporting the ceramic substrate 31 without forcing the ceramic substrate 31 to be excessively deformed, namely, without providing a risk of fracture of the ceramic substrate 31 even if the ceramic substrate 31 is upwardly or downwardly convexed rather than flat. Where the ceramic substrate 31 is upwardly convexed, the ceramic substrate 31 is supported by only the contacts of the upper end surfaces 420 of the supporting members 410. However, also in this case, the vibration of the ceramic substrate 31 is satisfactorily reduced. Still further, in the present embodiment in which the plurality of supporting members 410, 412 are arranged in the staggered pattern, the ceramic substrate 31 can be supported, at its plurality of portions which are distributed evenly over the entirety of the ceramic substrate 31 and which are distant from each other by a minimized distance, by the supporting members 410, 412, whereby the ceramic substrate 31 can be supported while being substantially flattened.

Figure 19:
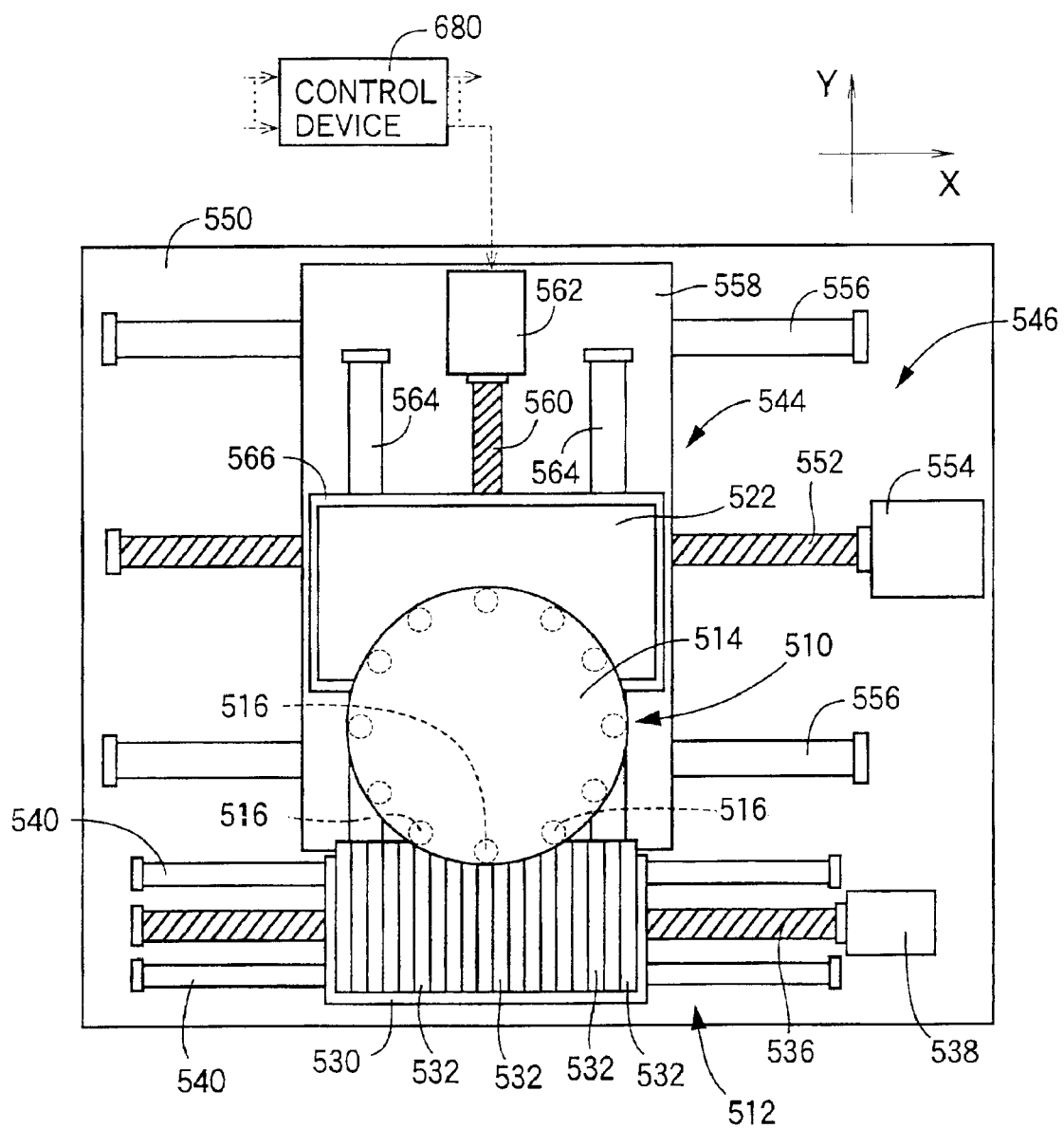
FIG. 19 is a plan view schematically showing the entirety of an electronic-component mounting system equipped with a substrate holding device which is constructed according to still another embodiment of the present invention.

An electronic-component mounting system equipped with a substrate holding device which is constructed according to another embodiment of the present invention will be explained in detail on the basis of the drawings. In FIG. 19, reference numerals 510, 512 denote a component mounting device and a component supplying device, respectively. The component mounting device 10 is equipped with an index table 514 which is intermittently rotatable about a vertical axis line. The index table 514 has a plurality of suction heads 516 each of which is a kind of mounting head (working head) and is capable of sucking and holding the electric component by applying a negative air pressure to the electric component. The index table 514 holds the suction heads 516 such that the suction heads 516 are equi-angularly spaced from one another about the vertical axis line. The index table 514 is intermittently rotated by an intermittently rotating device (not shown) including a cam, a cam follower, a rotary shaft, and an indexing servomotor for rotating the cam. With the intermittent rotation of the index table 514, the component suction heads 516 are sequentially moved to each of a plurality of operation positions such as a component sucking position (i.e., a component picking position), a component-posture detecting position, a component-posture correcting position, and a component mounting position. Each of the suction heads 516 is positioned in the selected one of the operating positions, so that the suction head 516 carries out the corresponding operation in the position. When the suction head 516 is positioned in the component mounting position, for example, the suction head 516 mounts the electric component on a printed circuit board 522. It is noted that the printed circuit board 522, as a sort of circuit substrate, consists of a ceramic substrate made principally of a fragile material in the form of a ceramic material in the present embodiment. The printed circuit board 522 will be referred to as "ceramic substrate 522" in the following descriptions.

The component supplying device 512 has a plurality of component feeders 532 each of which is mounted on a feeder supporting table 530. The component feeders 532 are supported on the supporting table 530 such that component-supply portions of the respective feeders 532 are arranged along a straight line on a horizontal plane (a direction parallel to this straight line will be referred to as the "X-axis direction"). As a ball screw 536 is rotated by an X-axis servomotor 538, the feeder supporting table 530 is moved in the X-axis direction while being guided by a pair of guide rails 540. Thus, the component supplying portion of a selected one of the component feeders 532 is moved to a component supplying position. The ball screw 536 and the X-axis servomotor 538 cooperate with each other to provide a table moving device for moving the feeder supporting table 530. In the present embodiment, each of the component feeders 532 includes a tape feeding device as a sort of component feeding device, and a tape-reel holding device as a sort of component storing device, and supplies a plurality of electric components by an electric-component carrier tape.

The ceramic substrate 522 is supported by a substrate positioning and supporting device 546 including an X–Y table 544, and is moved to a desired position on an X–Y plane by the substrate positioning and supporting device 546. The ceramic substrate 522 is loaded by a substrate loading device (not shown), onto the substrate positioning and supporting device 546 which is disposed together with the component mounting device 510 and the component supplying device 512 on a base 550. The ceramic substrate 522 is carried or unloaded by a substrate unloading device (not shown) from the substrate positioning and supporting device 546. The substrate loading and unloading devices include respective conveyor belts for conveying the ceramic substrate 522 in the X-axis direction. As shown in FIG. 19, the X–Y table 544 includes a ball screw 552 provided on the base 50, an X-axis servomotor 554 for rotating the ball screw 552, an X table 558 which is to be moved in the X-axis direction, a ball screw 560 provided on the X table 558, a Y-axis servomotor 562 for rotating the ball screw 560, and a Y table 566 which is to be moved in a Y-axis direction. As the ball screw 552 is rotated by the X-axis servomotor 554, the X table 558 is moved in the X-axis direction while being guided by a pair of guide rails 556. Similarly, as the ball screw 560 is rotated by the Y-axis servomotor 562, the Y table 566 is moved in the Y-axis direction while being guided by a pair of guide rails 564. Each of the servomotors is a sort of electric motor as an actuator, and is an electric rotary motor which is precisely controllable with respect to its rotation angle or amount. The servomotors may be replaced with stepping motors, and the electric rotary motors may be replaced with linear motors.

Figure 20:
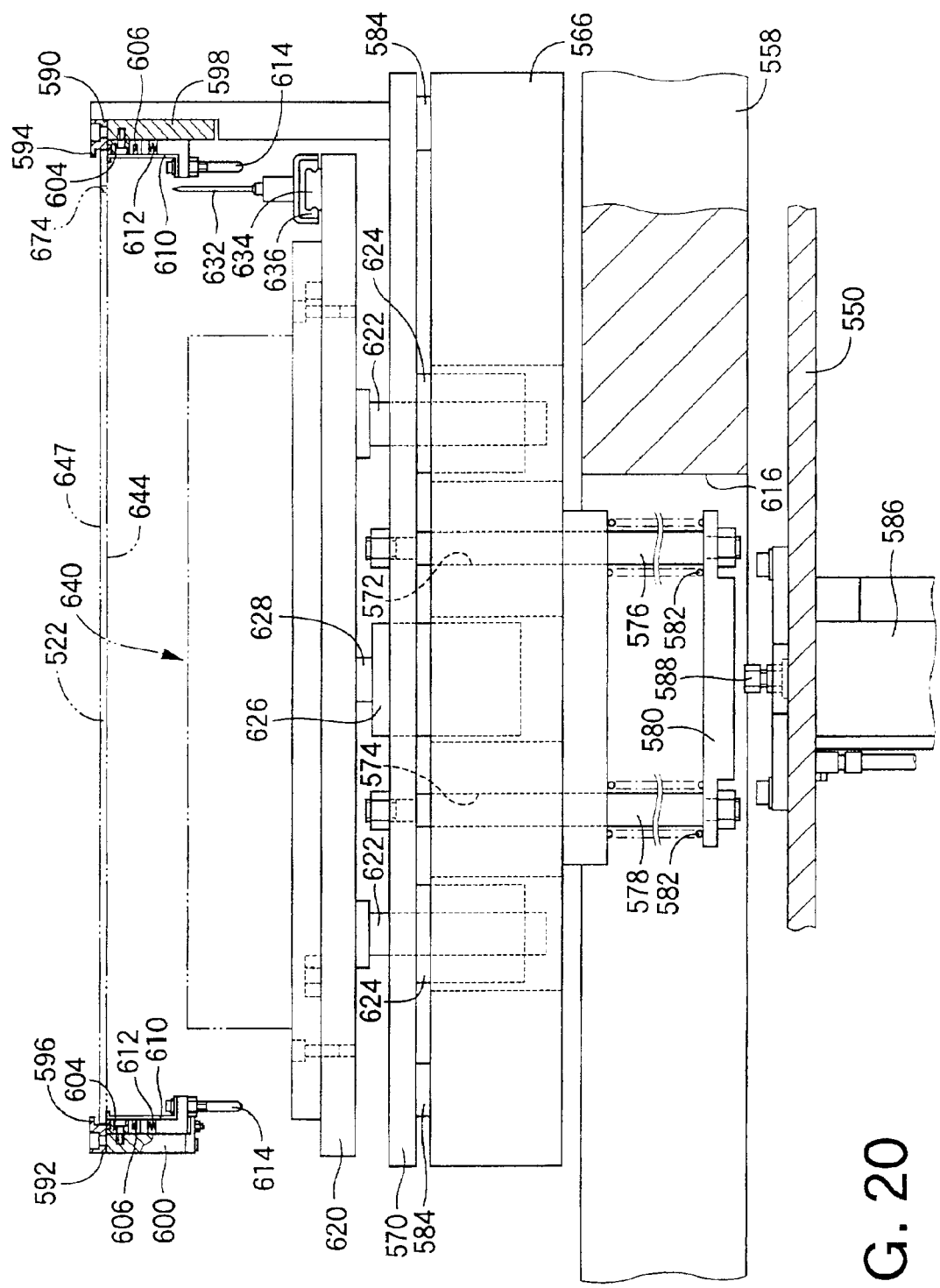
FIG. 20 is a front view (partially in cross section) of the above-described substrate holding device.

As shown in FIG. 20, on the Y table 566, there is provided a first elevator table 570 such that the first elevator table 570 is immovable in the X-axis and Y-axis directions relative to the Y table 566 and is movable in a vertical direction, i.e., a Z-axis direction perpendicular to the X-axis and Y-axis directions relative to the Y table 566. The Y table 566 has a pair of through-holes 572, 574 which are formed through its thickness in the vertical direction. A pair of rods 576, 578 are provided to extend through the respective through-holes 572, 574 such that each of the rods 576, 578 is movable in its axial direction relative to a corresponding one of the holes 576, 578. The first elevator table 570 is fixed to respective upper end portions of the two rods 576, 578 that project upwardly from the Y table 566.

The rods 576, 578 have respective lower end portions which project downwardly from the Y table 566 and which are connected to each other though a connection bar 580. Compression coil springs 582 (hereinafter referred simply as to "springs 582") each serving as an elastic member as a sort of biasing device are fitted on the respective lower end portions of the rods 576, 578 that project downwardly from the Y table 566. The springs 582 have respective lower ends which are seated on the connection bar 580. Owing to biasing forces of the springs 582, the first elevator table 570 is held in its lower movement end position in which the first elevator table 570 is held in contact with stoppers 584 provided on the Y table 566. On the base 550, there is provided an air cylinder 586 as a sort of fluid-pressure-operated cylinder as an actuator. The connection bar 580 can be lifted up by an adjusting bolt 588 fixed to a piston rod of the air cylinder 586, so that the first elevator table 570 is moved to its upper movement end position in which the first elevator table 570 is separated from the Y table 566 by a predetermined distance in the upward direction.

On the first elevator table 570, there are provided a fixed guide 590 and a movable guide 592. Each of the fixed and movable guides 590, 592 consists of an elongated member having a rectangular cross section. The fixed and movable guides 590, 592 include respective hold-down portions 594, 596 projecting from their respective upper end portions. The fixed guide 590 is fixed to a plate-like supporting member 598 such that the fixed guide 590 extends parallel to the X-axis direction. The supporting member 598 is fixed to one of two sides of the first elevator table 570 that are parallel to the X-axis direction, such that the supporting member 598 extends parallel to the X-axis direction. The movable guide 592 is fixed to another supporting member 600. Two slide members (not shown) are fitted in respective grooves which are formed in an upper surface of the first elevator table 570 and which are spaced apart from each other in the X-axis direction, such that the two slide members are movable in the Y-axis direction. The supporting member 600 is fixed at its lengthwise opposite end portions to respective upper end portions of the two slide members, so that the supporting member 600 extends parallel to the X-axis direction and accordingly the movable guide 592 also extends parallel to the X-axis direction. With the movement of the slide members, the movable guide 592 is moved toward and away from the fixed guide 590, whereby a width for guiding the ceramic substrate 522 is adjusted.

Belt guides 604 are fixed, below the fixed and movable guides 590, 592, to upper end portions of inner surfaces of the respective supporting members 598, 600 which surfaces are opposed to each other. Endless conveyor belts 606 are wound on the respective belt guides 604, and are driven in synchronization with each other by a belt drive device (not shown) including a drive motor as an actuator. Projecting members 610 are fitted in the respective supporting members 598, 600, such that each of the projecting members 610 is movable upwardly and downwardly. Each of the projecting members 610 consists of a plate-like member which is elongated in the X-axis direction, and is located inside a corresponding one of the conveyor belts 606 (on one of opposite sides of the corresponding conveyor belt 606 that is closer to the other conveyor belt 606). Each projecting member 610 is biased downwardly by a coil spring 612. The end of downward movement of each projecting member 610 by the biasing force of the corresponding spring 612 is defined by a stopper (not shown). In the state in which the projecting members 610 are held in their lower movement end position, upper ends of the projecting members 610 are substantially level with respective upper running portions (upper flat or straight portions) of the endless conveyor belts 606. Engaging pins 614 are fixed to opposite ends of each projecting member 610, respectively, that are distant from each other in the X-axis direction, such that each of the engaging pins 614 extends downwardly.

In the state in which the first elevator table 570 is held in its lower movement end position as shown in FIG. 20, the first elevator table 570 and the ceramic substrate 522 placed on the first elevator table 570 are positioned below the above-described board loading and unloading devices, and are moved together with the Y table 566 in the X-axis and Y-axis directions without being interfered by the board loading and unloading devices. The X table 558 has an opening 616 which is elongated in the Y-axis direction and which permits the rods 576, 578 (projecting downwardly from the Y table 566) and the connection bar 580, to be moved together with the Y table 566 in the Y-axis direction.

In the state in which the first elevator table 570 is held in its home position (in which the first elevator table 570 is aligned with the board loading and unloading devices as viewed in the Y-axis direction, is positioned between the board loading and unloading devices as viewed in the X-axis direction, and is held in its upper movement end position by the air cylinder 586), the height position of board-convey surfaces of the conveyor belts 606 that are defined by respective upper surfaces of the respective upper running portions of the conveyor belts 606 is the same as the height position of board-convey surfaces of conveyor belts of the board loading device that are defined by upper surfaces of respective upper running portions of the belts, and the height position of board-convey surfaces of conveyor belts of the board unloading device that are defined by upper surfaces of respective upper running portions of the belts. That is, at this home position, the first elevator table 570 receives the substrate 522 from the board loading device and discharges the substrate 522 to the board unloading device.

On the first elevator table 570, there is provided a second elevator table 620 consisting of a plate-like member, such that the second elevator table 620 can be elevated and lowered. A pair of guide rods 622 serving as guide members are fixed to a lower surface of the second elevator table 620. The guide rods 622 are fitted in respective guide bushings 624 which are fixed to a lower surface of the first elevator table 570, such that each of the guide rods 622 is movable in its axial direction relative to a corresponding one of the guide bushings 624. The guide bushings 624 are accommodated in respective holes formed through the thickness of the Y table 566, such that each of the bushings 624 is movable upwardly and downwardly. A piston rod 628 of an air cylinder 626 as a sort of fluid-pressure-operated actuator as a drive source, and also as a sort of fluid-pressure-operated cylinder device, is fixed to the lower surface of the second elevator table 620. The air cylinder 626, which is of a single action type, is fixed to the first elevator table 570 such that the air cylinder 626 extends in a vertical direction, and is accommodated in a hole formed through the thickness of the Y table 566, such that the air cylinder 626 is movable upwardly and downwardly relative to the Y table 566. When the piston rod 628 is extended out by a biasing force of a spring provided in a housing of the cylinder 626, the second elevator table 620 is moved upwardly relative to the first elevator table 570. When a compressed air is supplied to an air chamber provided in the housing, the piston rod 628 is retracted into the housing whereby the second elevator table 620 is moved downwardly relative to the first elevator table 570. A lower movement end position of the second elevator table 620 is defined by a stroke end of a piston (not shown) of the air cylinder 626.

As shown in FIG. 20, on the second elevator table 620, there are provided a main positioning pin (not shown) and an auxiliary positioning pin 632 which cooperate with each other to position the ceramic substrate 522 on a horizontal plane. The main and auxiliary positioning pins 632 are provided on the side of the fixed guide 590. The main positioning pin is fixed to the second elevator table 620, while the auxiliary positioning pin 632 is provided on the second elevator table 620 such that the auxiliary positioning pin 632 is movable in the X-axis direction. A guide rail 634 is fixed to the second elevator table 620 such that the guide rail 634 extends in the X-axis direction, and a block member 636 is fitted on the guide rail 634 such that the block member 636 is movable in the X-axis direction. The auxiliary positioning pin 632 is fixed to the block member 636, so that the auxiliary positioning pin 632 is movable toward and away from the main positioning pin in the X-axis direction. The position of the auxiliary positioning pin 632 is adjusted depending upon the size of the ceramic substrate 522.

A board supporting device 640 is fixed in a predetermined position on the second elevator table 620, so that the ceramic substrate 522 can be supported at its lower surface by the board supporting device 640. This board supporting device 640 is provided in an area which is defined by a two-dot chain line in FIG. 2. The board supporting device 640 may be constructed to include the backup pin 372 and the pin supporting member 374 as in the embodiment illustrated in FIGS. 1–13, or may be constructed to include the plurality of supporting members 410, 412 as in the embodiment illustrated in FIGS. 15–18. Or alternatively, the board supporting device 640 may be constructed to include a plurality of supporting members each having a suction portion which supports the ceramic substrate 522 with application of a vacuum pressure to the substrate 522. In any one of these cases, a lower one 644 of opposite surfaces of the ceramic substrate 522 constitutes a supported surface at which the ceramic substrate 522 is to be supported by the board supporting device 640, while the other of the opposite surfaces, i.e., an upper surface 647 of the ceramic substrate 522 constitutes a work surface onto which the electric component (not shown) is to be mounted.

Figure 21:
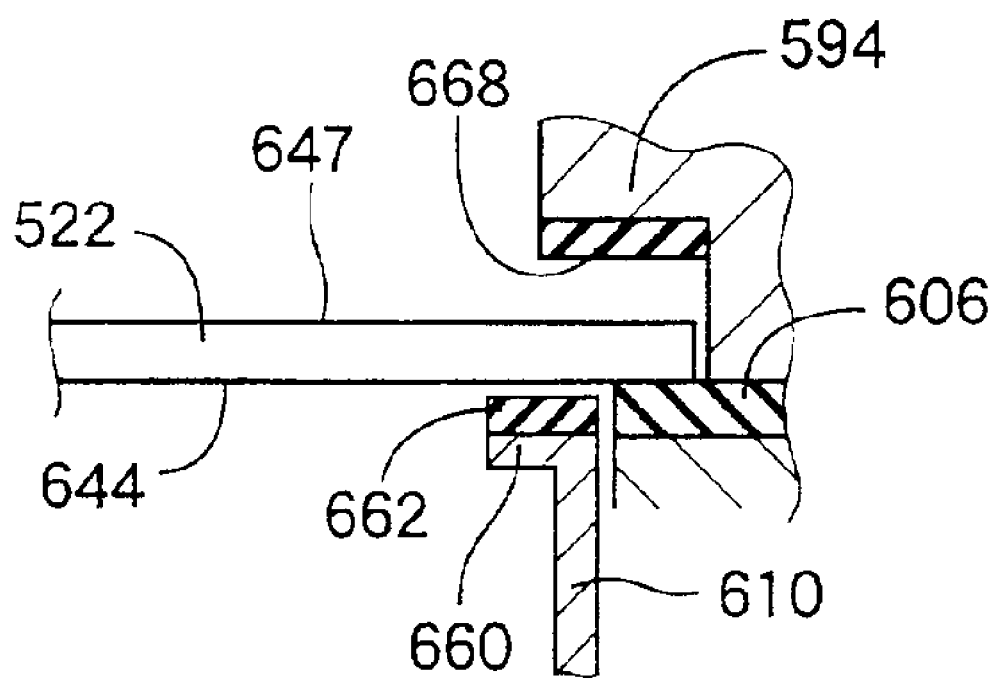
FIG. 21 is a side view in cross section of a movable member and a receiving member which are elements of the above-described substrate holding device.

As is apparent from the enlarged view of FIG. 21, each of the projecting members 610 has, in its upper end portion, a supporting portion 660 which projects horizontally inwardly of the conveyor belt 606. An elastically deformable portion 662 is integrally formed on an upper surface of the supporting portion 660 (which surface is opposed to the ceramic substrate 522). The elastically deformable portion 662 is formed of a rubber having a certain degree of an electric conductivity. Further, an elastically deformable portion 668 is integrally formed on a lower end portion of each of the hold-down portions 594, 596 which portion is opposed to the conveyor belt 606. FIG. 21 illustrates the elastically deformable portion 668 provided in the hold-down portion 594. In the present embodiment, each of the projecting members 610 constitutes a movable member, while each of the hold-down portions 594, 596 constitutes a receiving member. The projecting members 610 as the movable members and the holding-down portions 594, 596 as the receiving members cooperate with one another to constitute a substrate clamping device. The rubber having a certain degree of electric conductivity is one example of a rubber or its equivalent material which are preferably used for forming the elastically deformable portions 662, 668.

The present electronic-component mounting system is controlled by a control device 680 (see FIG. 19), to which there are connected the X-axis servomotors 538, 554, the Y-axis servomotor 562 and (the control valves of) the air cylinders 586, 626.

When the ceramic substrate 522 is to be loaded onto the board positioning and supporting device 546, the conveyor belts of the board loading device and the board positioning and supporting device 546 are driven or circulated. In this instance, the first elevator table 570 is held in its upper movement end position, while the second elevator table 620 is held in its lower movement end position. Thus, as the conveyor belts are circulated, the ceramic substrate 522 is loaded onto the board positioning and supporting device 546 from the board loading device. The loading movement of the ceramic substrate 522 is stopped by a stopper (not shown) which is positioned in an operative position. After the conveyor belts 606 are stopped, the second elevator table 620 is moved upwardly relative to the first elevator table 570. When the second elevator table 620 is being elevated, the second elevator table 620 is brought into engagement with the engaging pins 614, thereby causing the projecting members 610 to be moved upwardly against the biasing forces of the coil springs 612, and then lifting the ceramic substrate 522 up away from the conveyor belts 606. As the second elevator table 620 is elevated, the main and auxiliary board positioning pins 632 and the board supporting device 640 are elevated, so that the positioning pins are fitted in a main positioning hole (not shown) and an auxiliary positioning hole 674, for thereby positioning the ceramic substrate 522 relative to the second elevator table 620. When the ceramic substrate 522 is thus poisoned relative to the second elevator table 620, the ceramic substrate 522 is supported at its lower surface 644 by the board supporting device 640 which are brought into contact with the lower surface 644. When the ceramic substrate 522 is lifted up by the projecting members 610 and then brought into contact with the hold-down portions 594, 596, the board supporting device 640 is also brought into contact with the ceramic substrate 522 while the main and auxiliary positioning pins 632 are fitted into the main and auxiliary positioning holes 674 to position the ceramic substrate 522 relative to the second elevator board 620. In other words, the ceramic substrate 522 is positioned by the main and auxiliary board positioning pins 632, while the ceramic substrate 522 is gripped by the hold-down portions 594, 596 and the projecting members 610 and is also supported at its lower surface 644 by the board supporting device 640. In the present embodiment, since the contact portions of the hold-down portions 594, 596 and the projecting members 610 are provided by the elastically deformable portions 662, 668, it is possible to avoid stress concentration in a local portion or portions of the contact surfaces of the ceramic substrate 522 at which the ceramic substrate 522 is brought into contact with the hold-down portions 594, 596 and the projecting members 610, thereby avoiding damaging of the ceramic substrate 522. Further, since the elastically deformable portions 662, 668 are made of the rubber having the electric conductivity, the ceramic substrate 522 can be prevented from being electrified while being clamped.

The air cylinder 626 may be a double acting cylinder, as the above-described clamp cylinder 350. In this case, a variable flow regulator valve having the same construction as the above-described variable flow regulator valve 366 may be provided in an air passage which communicates a rod-side chamber of the air cylinder 626 with an air source, while an electromagnetically-operated proportional control valve having the same construction as the above-described proportional control valve 368 may be provided in an air passage which communicates a head-side chamber of the air cylinder 626 with the air source. Or alternatively, the variable flow regulator valve and the electromagnetically-operated proportional control valve may be provided in the air passage which communicates the head-side chamber of the air cylinder 626 with the air source, such that the flow regulator valve and the proportional control valve are located near the head-side chamber and the air source, respectively. In either case, the variable flow regulator valve can be controlled by the control device 680 such that the flow regulator valve is choked in a final stage of the upward movement of the second elevator table 620, whereby the velocity of the upward movement of the second elevator table 620 (and accordingly the velocity of the upward movement of the projecting members 610) can be reduced. Thus, the projecting members 610 can be brought into abutting contact with the ceramic substrate 522 with a reduced impact. Further, the valve-opening pressure of the electromagnetically-operated proportional control valve can be set at a suitable value depending upon, for example, the thickness of the ceramic substrate 522, for thereby making it possible to appropriately control a clamping force of the projecting members 610.

It is also possible to form a coating layer such as a diamond coating (DLC) on side surfaces of the fixed and movable guides 590, 592, i.e., guide surfaces for guiding the ceramic substrate 522. Further, it is also possible to form an elastically deformable portion made of a rubber or its equivalent material, on a contact surface of the above-described stopper which is brought into contact with the ceramic substrate 522 to stop the movement of the ceramic substrate 522 in the substrate positioning and supporting device 546.

The substrate holding device of the present invention can be employed also in an electronic-component mounting system in which a fragile-material-made substrate is linearly moved in a predetermined direction while a mounting head (suction head) is linearly moved in a direction that is perpendicular to the predetermined direction in a plane, or an electro-component mounting system in which a fragile-material-made substrate is fixed in a predetermined position while a mounting head is moved to be positioned in a desired position in a plane. Where a head moving device carries and moves carries a plurality of mounting heads in a plane, each mounting head may be adapted to be immovable in a direction parallel to the plane, or alternatively, the head moving device may be adapted to move a mounting device (in which the plurality of mounting heads are rotated about a common axis and are sequentially positioned in each of operation positions) in a desired position in a plane.

Further, the substrate holding device of the present invention can be employed also in a board work system (adhesive applying system) equipped with a working head (applying head) capable of applying an adhesive as a highly viscous fluid to a circuit substrate, as described in JP-A-H09-75830.

While the several embodiments of this invention have been described above in detail, for illustrative purpose only, it is to be understood that the present invention may be embodied with various other changes and modifications, such as those described in the above-described "SUMMARY OF THE INVENTION", which can be made on based on knowledge of those skilled in the art.

What is claimed is:

1. A substrate holding device for holding a circuit substrate, said substrate holding device comprising:
   a substrate clamping device including a receiving member and a movable member which is movable to force a portion of the circuit substrate against said receiving member, for thereby clamping the circuit substrate;
   an actuator which actuates said movable member; and
   a movement-velocity controlling device controlling a movement velocity of said movable member actuated by said actuator,
   wherein at least one of said receiving member and said movable member has an elastically deformable portion provided by a contact portion thereof which is to be brought into contact with the circuit substrate.

2. A substrate holding device according to claim 1, wherein said elastically deformable portion has an electric conductivity.

3. A substrate holding device according to claim 1, wherein said movement-velocity controlling device has a velocity reducing portion which reduces the movement velocity of said movable member in a final stage of forward movement of said movable member toward said receiving member.

4. A substrate holding device according to claim 3, wherein said velocity reducing portion gradually reduces the movement velocity of said movable member to substantially zero.

5. A substrate holding device according to claim 1, wherein said actuator is an air cylinder, and said movement-velocity controlling device includes an air-flow-rate controlling device controlling a flow rate of air to be supplied to said air cylinder.

6. A substrate holding device according to claim 5, wherein said air-flow-rate controlling device includes a variable flow regulator valve having an air passage whose cross sectional area is variable, and a regulator-valve controlling device which reduces the cross sectional area of the air passage of said variable flow regulator valve in a final stage of forward movement of said movable member toward said receiving member.

7. A substrate holding device according to claim 1, comprising:
   an actuation-force controlling device controlling an actuation force with which said movable member is actuated by said actuator.

8. A substrate holding device according to claim 7, wherein said actuation-force controlling device controls said actuation force on the basis of at least one of a material of said circuit substrate and a size of said circuit substrate.

9. A substrate holding device according to claim 1,
   wherein said substrate clamping device includes a pair of elongated main bodies each of which holds said receiving member and said movable member,
   wherein said pair of elongated main bodies of said substrate clamping device are positioned relative to each other such that said pair of elongated main bodies extend along opposite end portions of said circuit substrate that is substantially rectangular, so that said rectangular circuit substrate can be clamped, at each of said opposite end portions, by said receiving member and said movable member of a corresponding one of said pair of elongated main bodies.

10. A substrate holding device according to claim 1, wherein said elastically deformable portion is formed of a rubber or a material equivalent to the rubber.

11. A substrate holding device according to claim 1, wherein said elastically deformable portion is formed of a rubber.

12. A substrate holding device according to claim 1, wherein said movable member is movable toward said receiving member in a direction substantially parallel with a thickness direction of the circuit substrate, for thereby clamping the circuit substrate.

13. A substrate holding device according to claim 1, comprising an actuator which actuates said movable member and which is provided by at least one of an electric motor and a fluid-pressure-operated cylinder.

14. A substrate holding device for holding a circuit substrate, said substrate holding device comprising:
   a substrate clamping device including a receiving member and a movable member which is movable to force a portion of the circuit substrate against said receiving member, for thereby clamping the circuit substrate;
   an actuator which actuates said movable member; and
   an actuation-force controlling device controlling, on the basis of at least one of a material of said circuit substrate and a size of said circuit substrate, an actuation force with which said movable member is actuated by said actuator, wherein
   at least one of said receiving member and said movable member has an elastically deformable portion provided by a contact portion thereof which is to be brought into contact with the circuit substrate,
   said actuator is an air cylinder,
   and said actuation-force controlling device includes an air-pressure controlling device controlling a pressure of air to be supplied to said air cylinder.

15. A substrate holding device for holding a circuit substrate, said substrate holding device comprising:
   a substrate clamping device including a receiving member and a movable member which is movable to force a portion of the circuit substrate against said receiving member, for thereby clamping the circuit substrate,
   an actuator which actuates said movable member; and
   a movement-velocity controlling device controlling a movement velocity of said movable member actuated by said actuator,
   wherein said movement-velocity controlling device has a velocity reducing portion which reduces the movement velocity of said movable member in a final stage of forward movement of said movable member toward said receiving member.

16. A substrate holding device according to claim 15, wherein:

said actuator is an air cylinder, said movement-velocity controlling device includes an air-flow-rate controlling device controlling a flow rate of air to be supplied to said air cylinder, said air-flow-rate controlling device including a variable flow regulator valve having an air passage whose cross sectional area is variable, and said velocity reducing portion of said movement-velocity controlling device reduces the cross sectional area of said air passage of said variable flow regulator valve in the final stage of the forward movement of said movable member toward said receiving member.

* * * * *